(12) United States Patent
Lin et al.

(10) Patent No.: US 6,492,252 B1
(45) Date of Patent: Dec. 10, 2002

(54) METHOD OF CONNECTING A BUMPED CONDUCTIVE TRACE TO A SEMICONDUCTOR CHIP

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 09/997,973

(22) Filed: Nov. 29, 2001

Related U.S. Application Data

(63) Continuation-in-part of application No. 09/917,339, filed on Jul. 27, 2001, which is a continuation-in-part of application No. 09/878,626, filed on Jun. 11, 2001, which is a continuation-in-part of application No. 09/687,619, filed on Oct. 13, 2000, now Pat. No. 6,440,835.

(51) Int. Cl.[7] .............................................. H01L 21/44
(52) U.S. Cl. ........................................ 438/612; 252/783
(58) Field of Search ................................ 438/612, 614; 257/778, 783

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |

(List continued on next page.)

FOREIGN PATENT DOCUMENTS

| | | | | |
|---|---|---|---|---|
| EP | 0 718 882 A1 | 6/1996 | ......... | H01L/23/057 |
| WO | WO 91/38563 | 10/1997 | ............ | H05K/1/03 |
| WO | WO 99/57762 | 11/1999 | ........... | H01L/23/48 |

OTHER PUBLICATIONS

Markstein et al., "Controlling the Variables in Stencil Printing," Electronic Packaging & Production, Feb. 1997, pp. 48–56.

(List continued on next page.)

*Primary Examiner*—David Nelms
*Assistant Examiner*—Quoc Hoang
(74) *Attorney, Agent, or Firm*—David M. Sigmond

(57) ABSTRACT

A method of connecting a conductive trace to a semiconductor chip includes providing a semiconductor chip, a conductive trace and a base, wherein the chip includes a conductive pad, the base includes a recess, the conductive trace includes a bumped terminal in the recess, the bumped terminal includes a cavity that extends into and faces away from the recess, the base contacts and covers the conductive trace on a side opposite the chip, and the conductive trace and the base are different metals, mechanically attaching the chip to the conductive trace using an insulative adhesive that extends into the cavity, etching the base to expose the conductive trace, and forming a connection joint that contacts and electrically connects the conductive trace and the pad. Preferably, the bumped terminal is inside a periphery of the chip, and the adhesive fills the cavity.

180 Claims, 40 Drawing Sheets

U.S. PATENT DOCUMENTS

| | | | |
|---|---|---|---|
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A * | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khanros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |

OTHER PUBLICATIONS

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665.928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through-Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

* cited by examiner

METHOD OF CONNECTING A BUMPED CONDUCTIVE TRACE TO A SEMICONDUCTOR CHIP

CROSS-REFERENCE TO RELATED APPLICATIONS

This application is a continuation-in-part of U.S. application Ser. No. 09/917,339 filed Jul. 27, 2001, which is a continuation-in-part of U.S. application Ser. No. 09/878,626 filed Jun. 11, 2001 which is a continuation-in-part of U.S. application Ser. No. 09/687,619 filed Oct. 13, 2000, now U.S. Pat. No. 6,440,835, each of which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. However, the contact portions do not yet provide an electrical connection to a support circuit. In order to make this connection, additional process steps are necessary, such as thermocompression bonding the contact portions to TAB inner leads, or disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering and bonding the conductive epoxy to corresponding conductive patterns on support frames. Thus, multiple process steps are necessary to electrically connect the chips to the support frames after forming the ball bonds. In addition, care must be taken to ensure that the epoxy does not flow excessively and short the leads.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing semiconductor chip assemblies as chip scale packages, chip size packages, ball grid arrays or other structures.

In accordance with one aspect of the invention, a method of connecting a conductive trace to a semiconductor chip includes providing a semiconductor chip, a conductive trace and a base, wherein the chip includes a conductive pad, the base includes a recess, the conductive trace includes a bumped terminal in the recess, the bumped terminal includes a cavity that extends into and faces away from the recess, the base contacts and covers the conductive trace on a side opposite the chip, and the conductive trace and the base are different metals, mechanically attaching the chip to the conductive trace using an insulative adhesive that extends into the cavity, etching the base thereby exposing the conductive trace, and forming a connection joint that contacts and electrically connects the conductive trace and the pad.

Preferably, the method includes etching the base to form the recess, electroplating the conductive trace onto the base, filling the adhesive into the cavity, sandwiching the adhesive between the conductive trace and the pad, and then etching the adhesive thereby exposing the pad after etching the base and before forming the connection joint.

The method may also include providing the conductive trace with a routing line outside the recess, and attaching the chip to the conductive trace such that the bumped terminal is inside a periphery of the chip and outside a periphery of the pad and the routing line overlaps the pad.

The method may also include forming an encapsulant on a side of the chip opposite the pad after attaching the chip to the conductive trace and before etching the base, and forming an insulative base on the conductive trace, the adhesive and the connection joint after etching the base.

In accordance with another aspect of the invention, a semiconductor chip assembly includes a semiconductor chip that includes a conductive pad, a conductive trace that includes a bumped terminal and a routing line, wherein the bumped terminal includes a cavity that faces towards the chip, an insulative adhesive that contacts and is sandwiched between the conductive trace and the chip and extends into the cavity, and a connection joint that extends through an opening in the adhesive and contacts and electrically connects the conductive trace and the pad.

Preferably, the connection joint contacts a surface of the conductive trace that overlaps and faces away from the pad, the connection joint contacts opposing peripheral sidewalls of the conductive trace that overlap and are orthogonal to the pad, the connection joint is the only electrical conductor external to the chip that contacts the pad, the connection joint and the adhesive are the only materials external to the chip that contact the pad, the connection joint and the adhesive are the only materials that contact both the conductive trace and the pad, and the adhesive contacts and is sandwiched between the conductive trace and the pad.

An advantage of the present invention is that the semiconductor chip assembly includes a conductive trace with a bumped terminal that can be used for the next level assembly, and the bumped terminal includes a cavity that can be filled with the die attach adhesive. Another advantage is that the assembly need not include wire bonds and solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
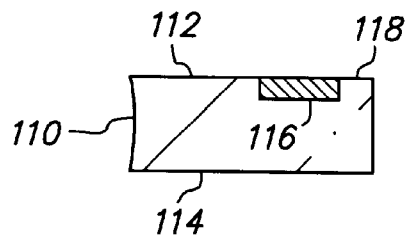
FIGS. 1A–1O are cross-sectional views showing a method of connecting a conductive trace to a semiconductor chip in accordance with a first embodiment of the present invention.
Figure 2A:
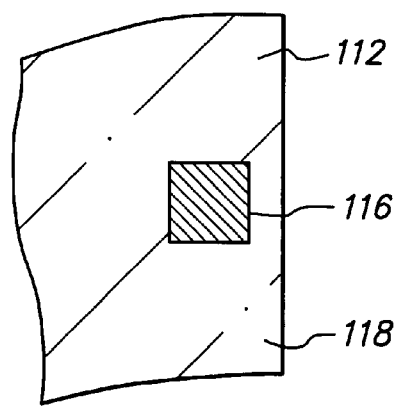
FIGS. 2A–2O are top plan views corresponding to FIGS. 1A–1O, respectively.
Figure 3A:
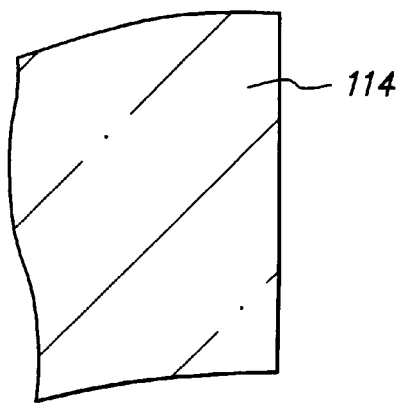
FIGS. 3A–3O are bottom plan views corresponding to FIGS. 1A–1O, respectively.
Figure 1B:
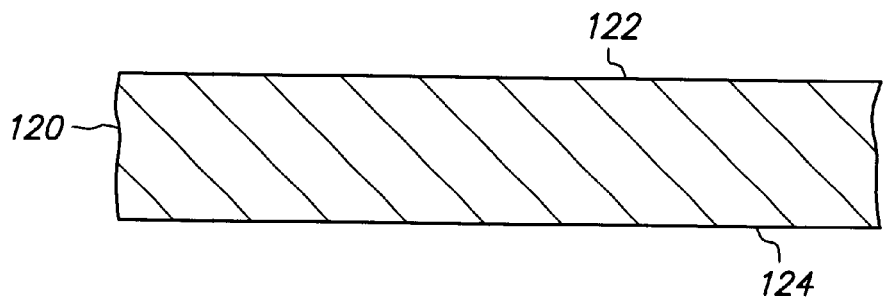
Figure 2B:
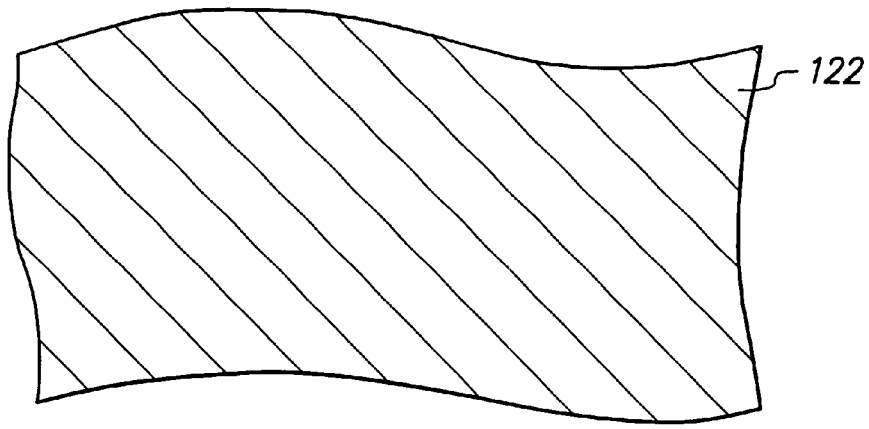
Figure 3B:
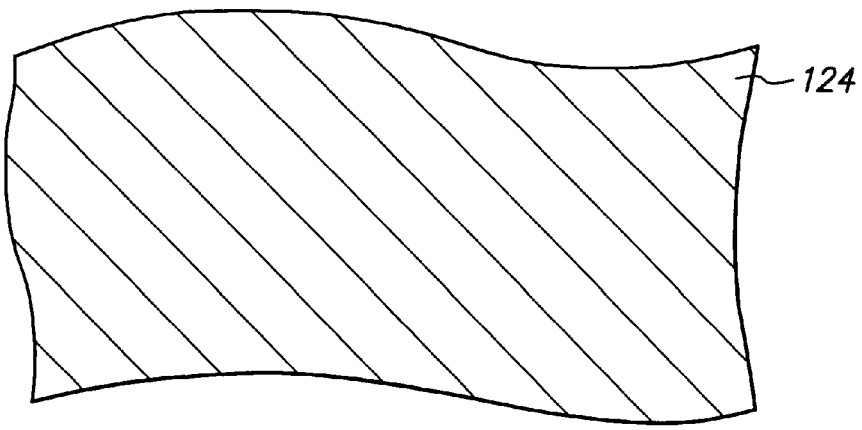
Figure 1C:
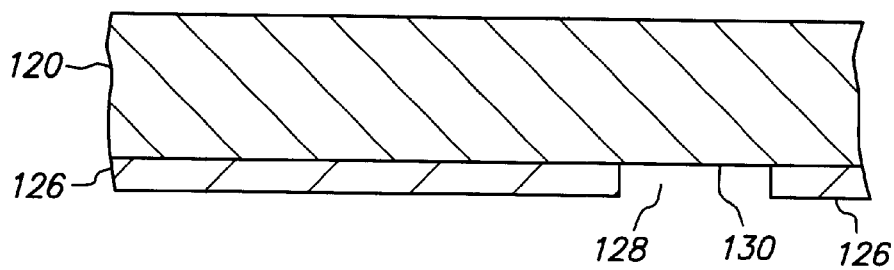
Figure 2C:
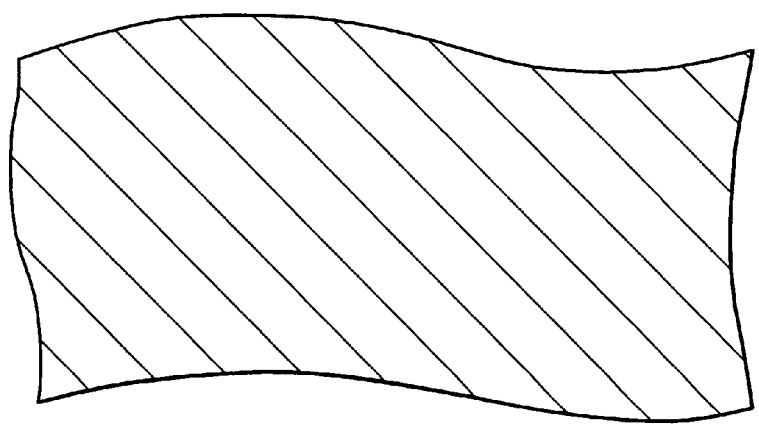
Figure 3C:
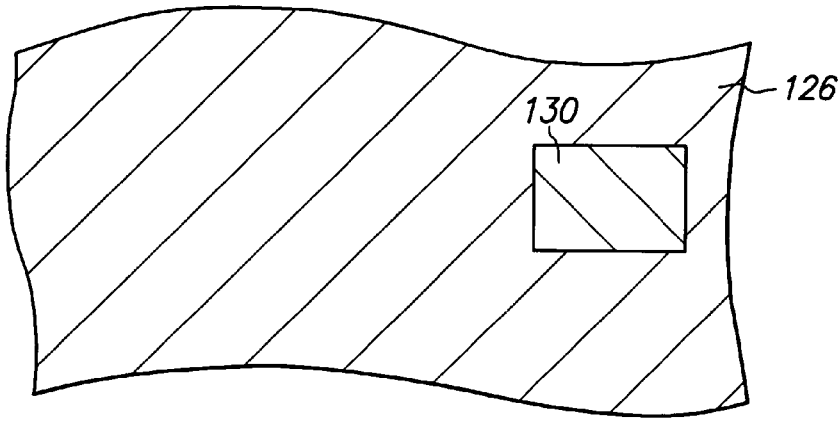
Figure 1D:
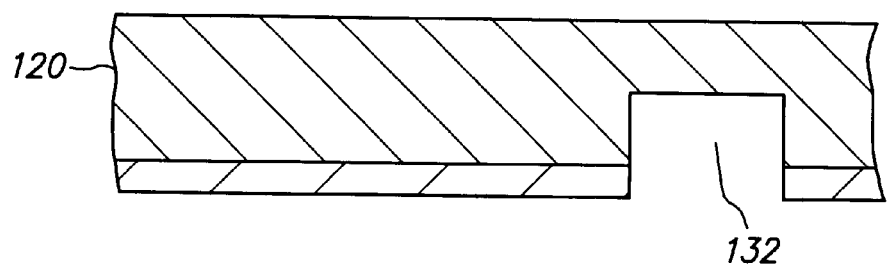
Figure 2D:
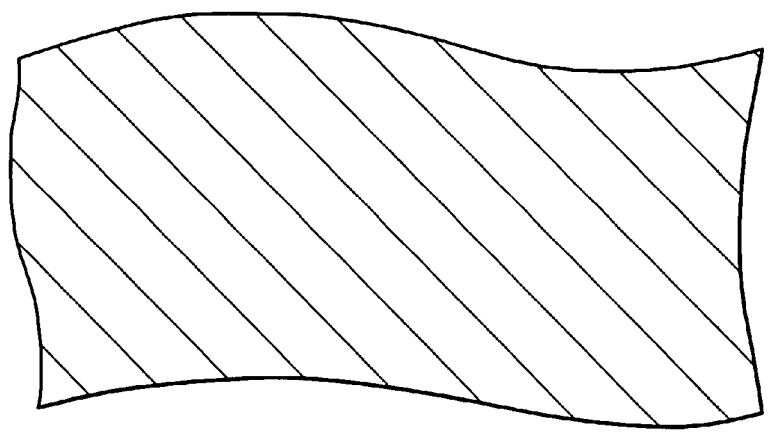
Figure 3D:
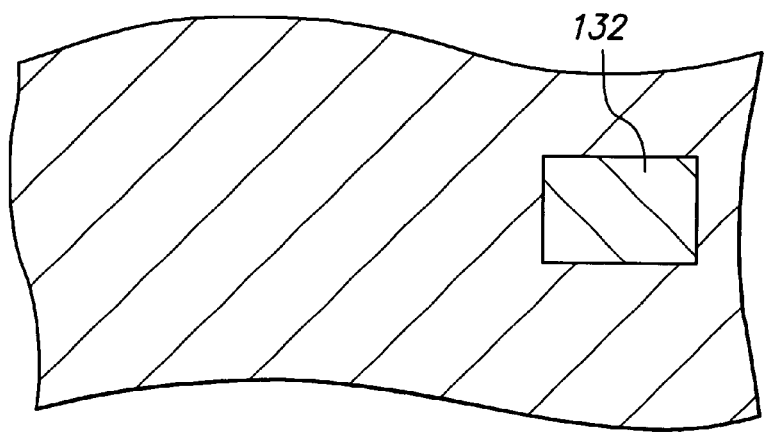
Figure 1E:
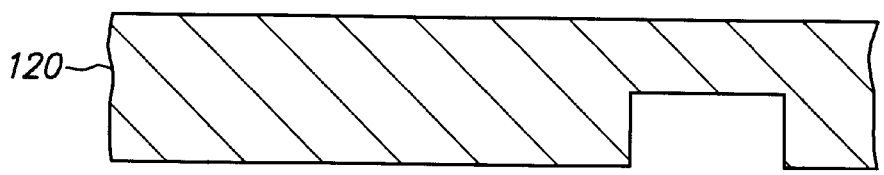
Figure 2E:
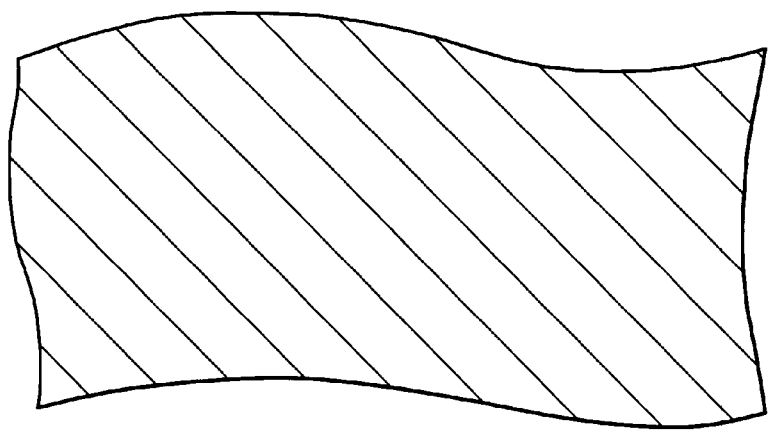
Figure 3E:
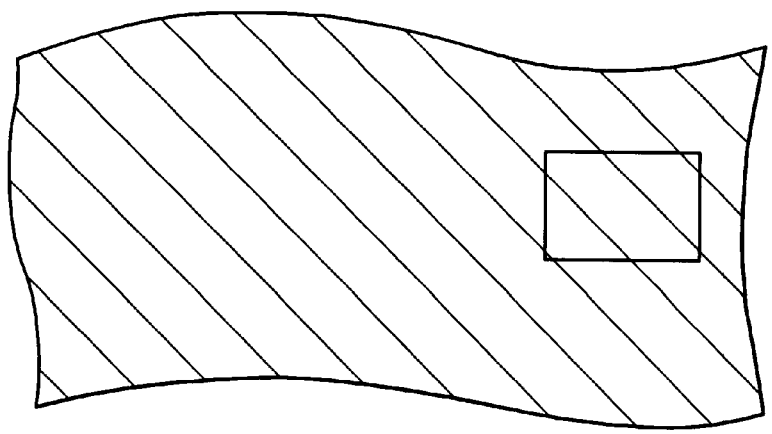
Figure 1F:
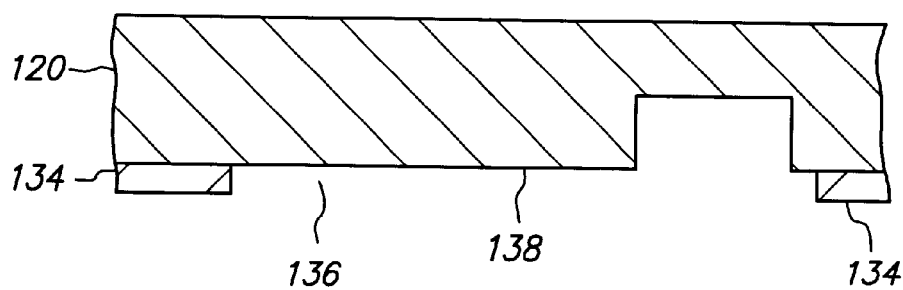
Figure 2F:
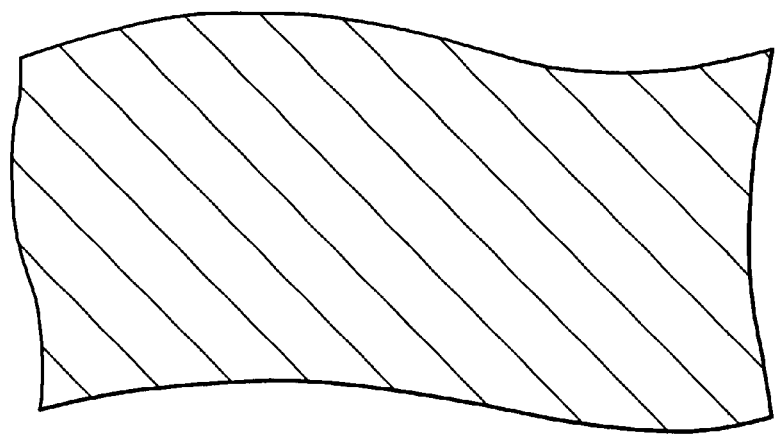
Figure 3F:
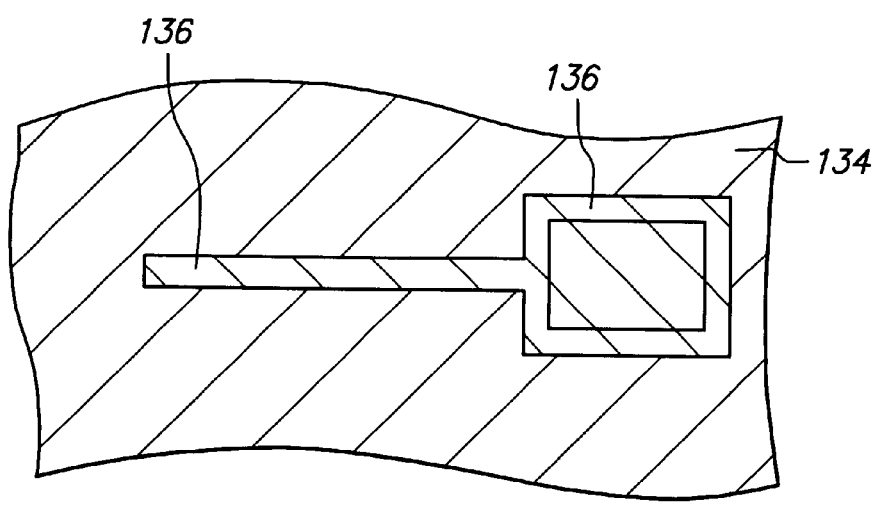
Figure 1G:
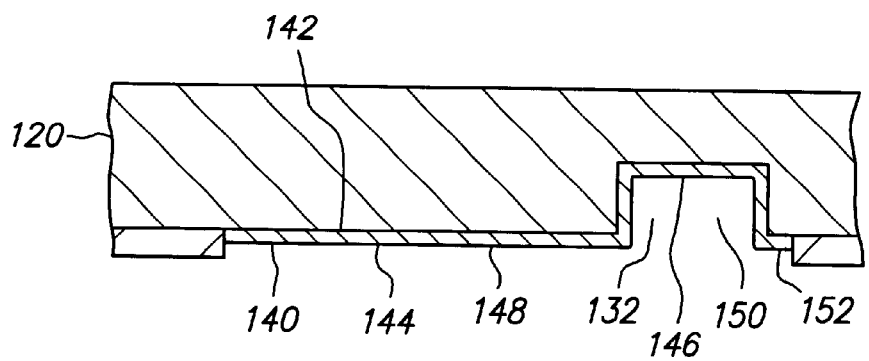
Figure 2G:
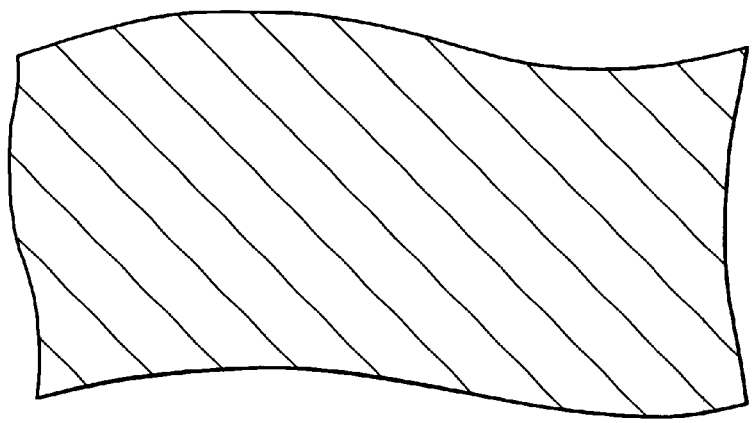
Figure 3G:
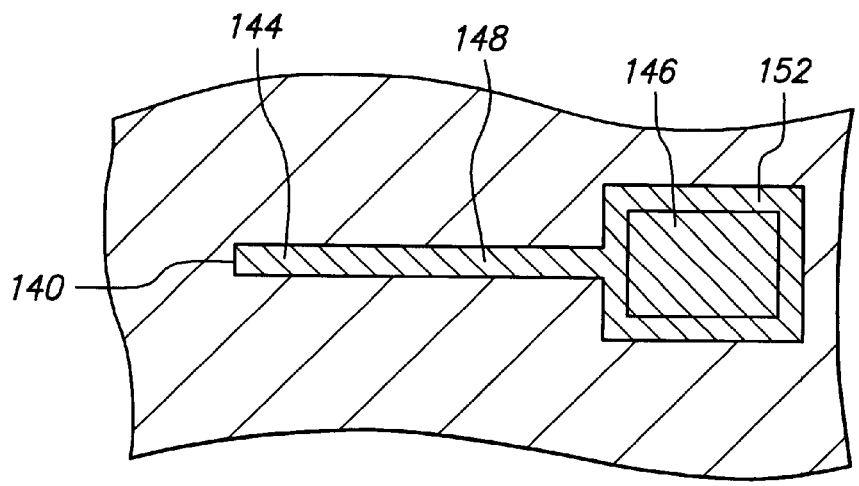
Figure 1H:
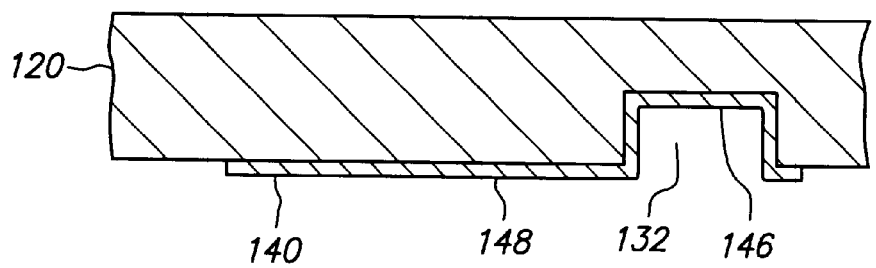
Figure 2H:
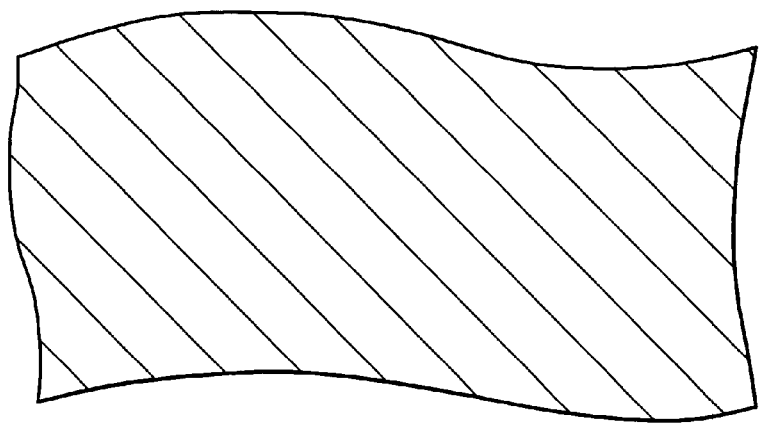
Figure 3H:
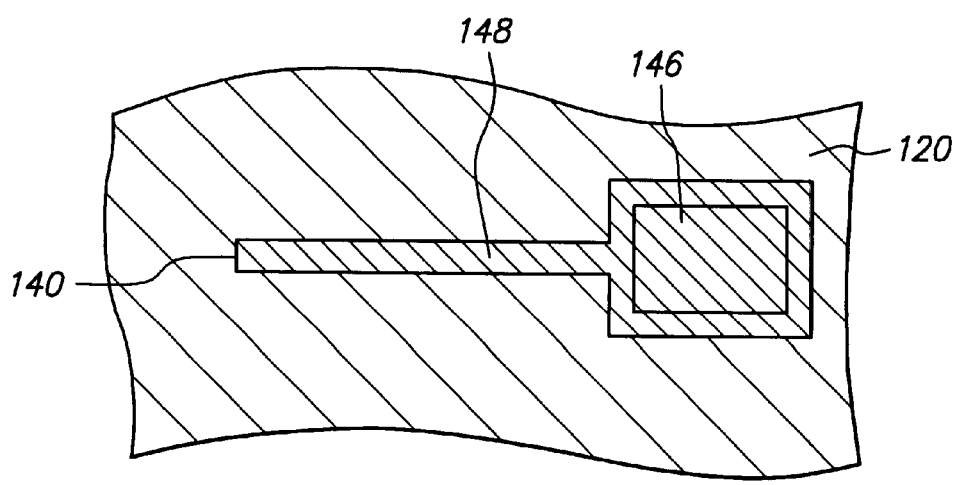
Figure 1I:
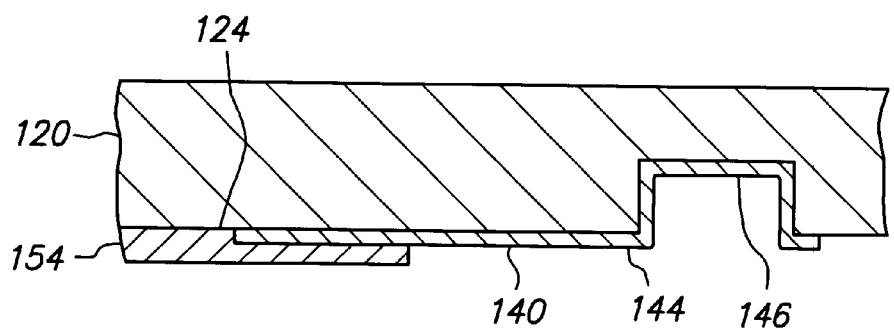
Figure 2I:
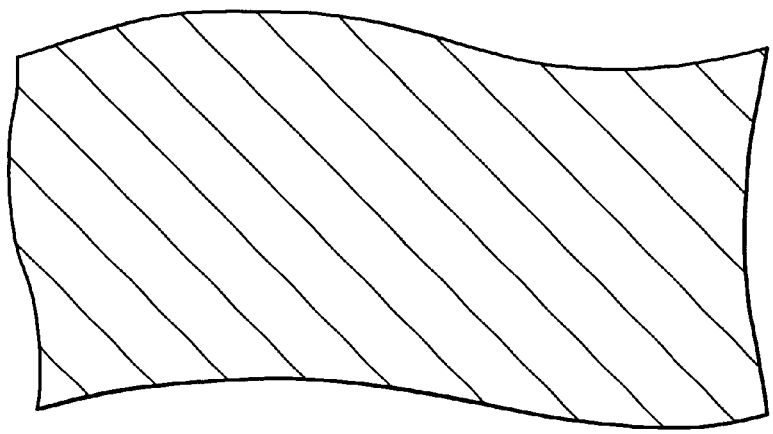
Figure 3I:
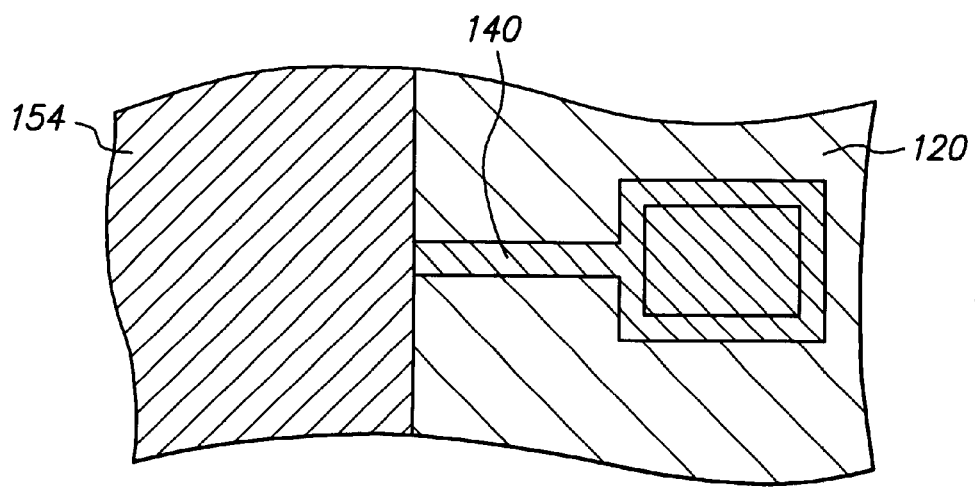
Figure 1J:
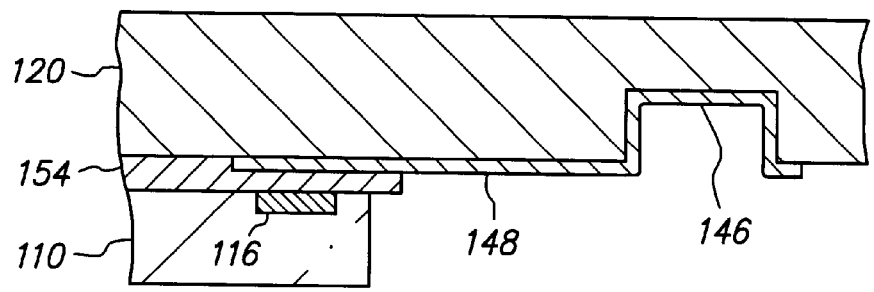
Figure 2J:
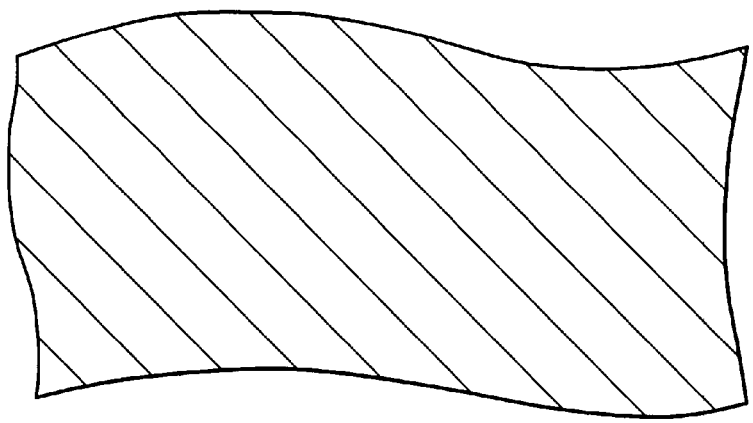
Figure 3J:
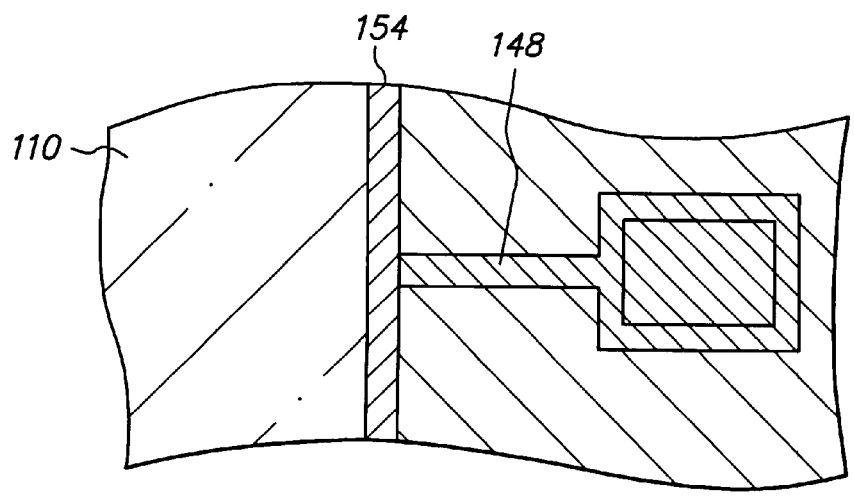
Figure 1K:
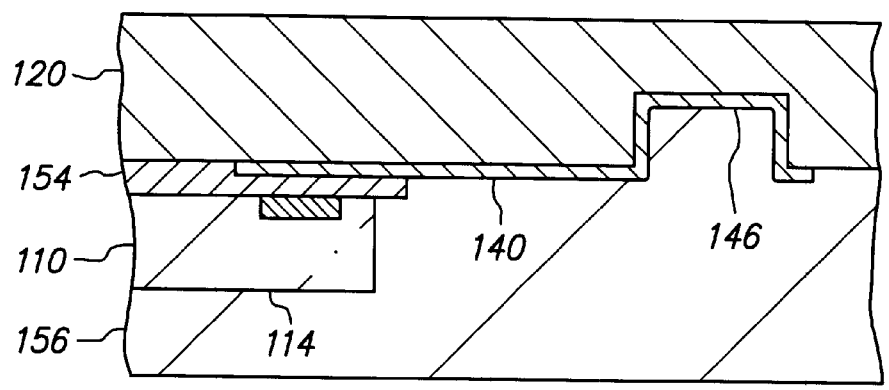
Figure 2K:
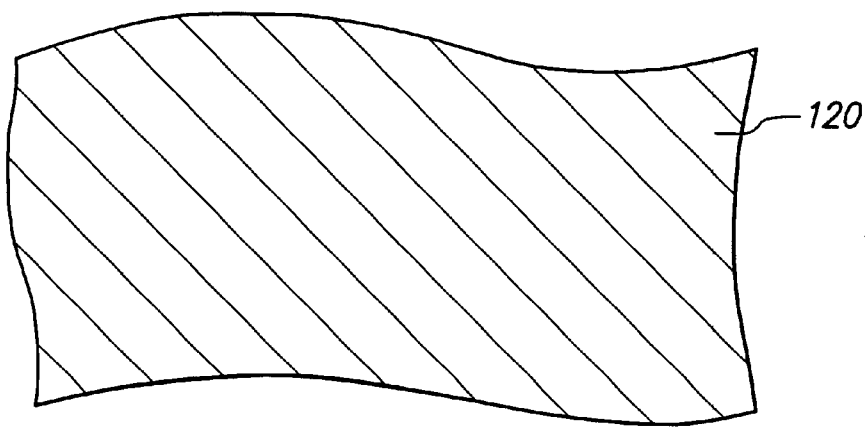
Figure 3K:
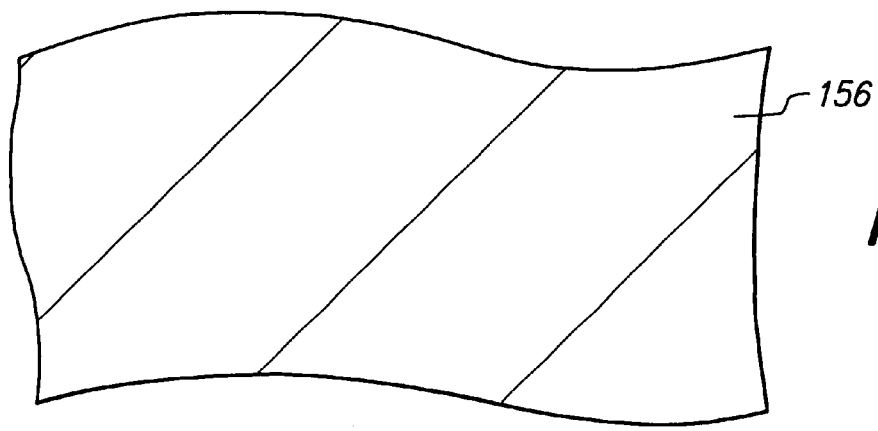
Figure 1L:
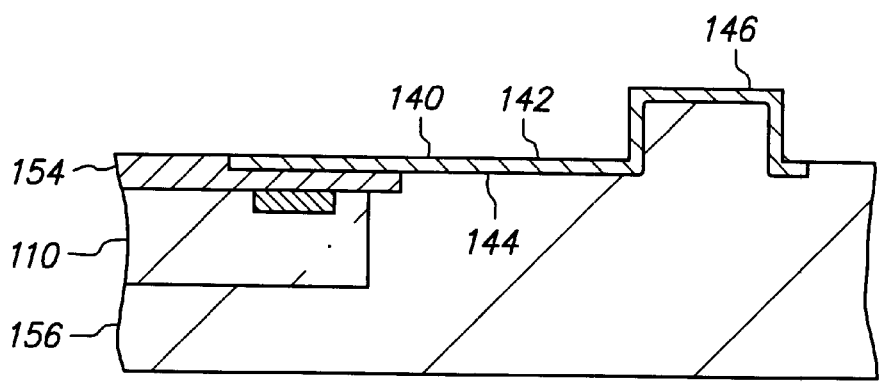
Figure 2L:
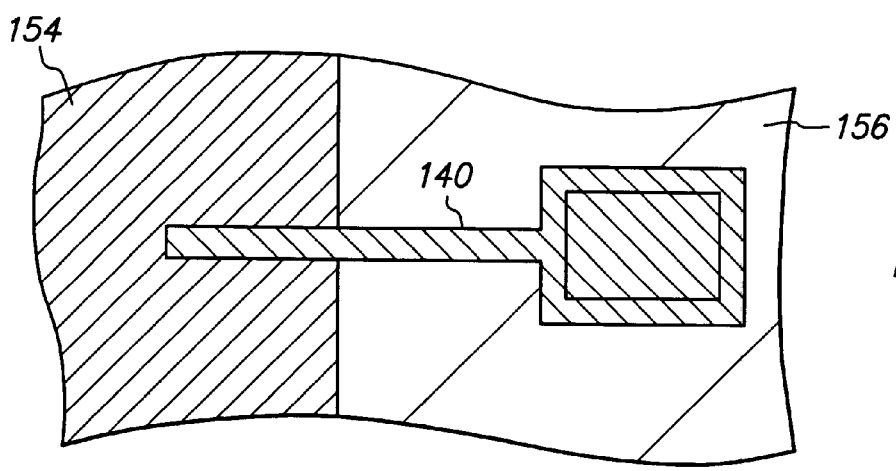
Figure 3L:
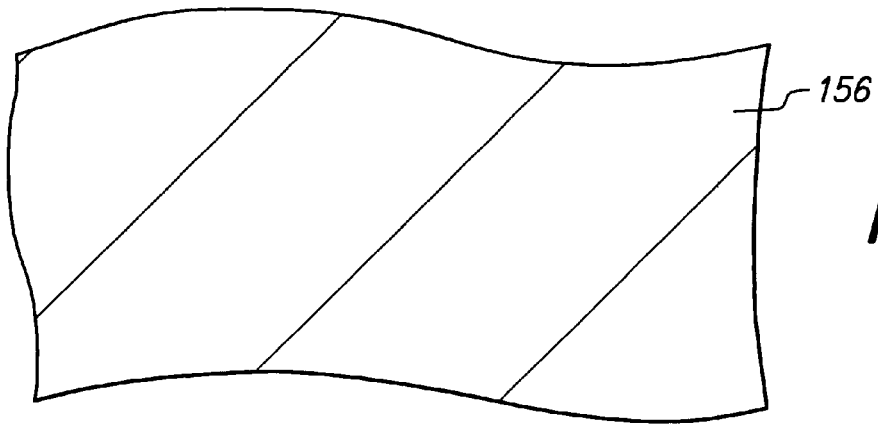
Figure 1M:
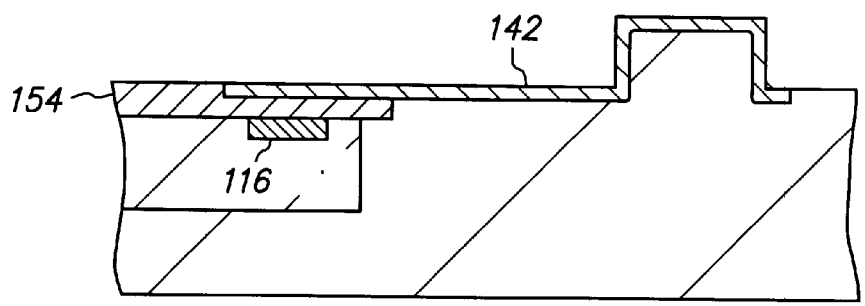
Figure 2M:
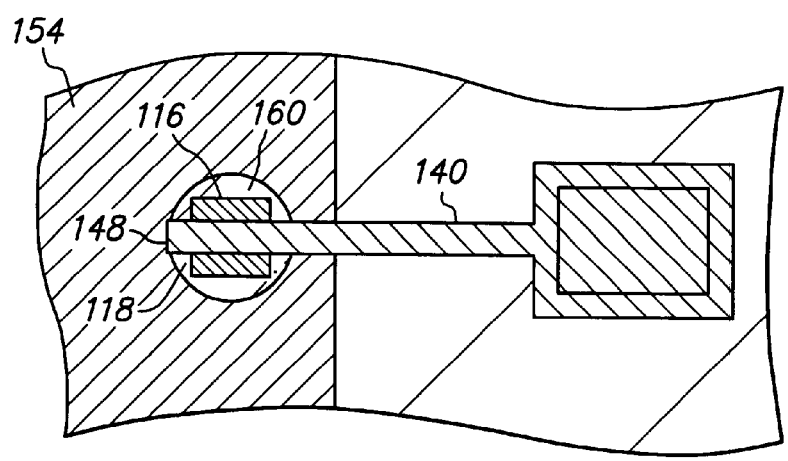
Figure 3M:
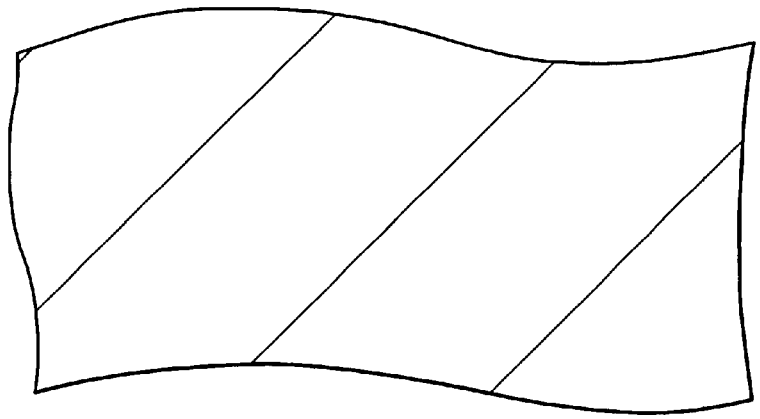
Figure 1N:
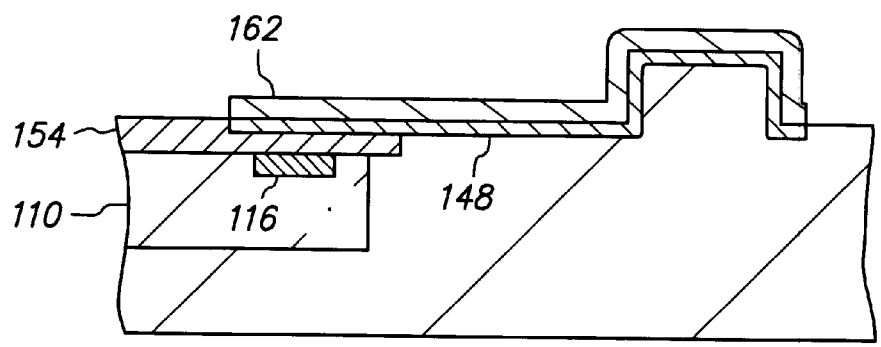
Figure 2N:
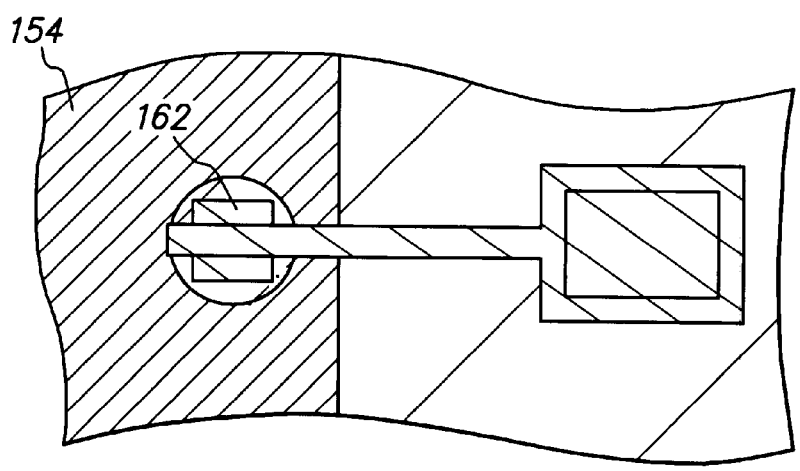
Figure 3N:
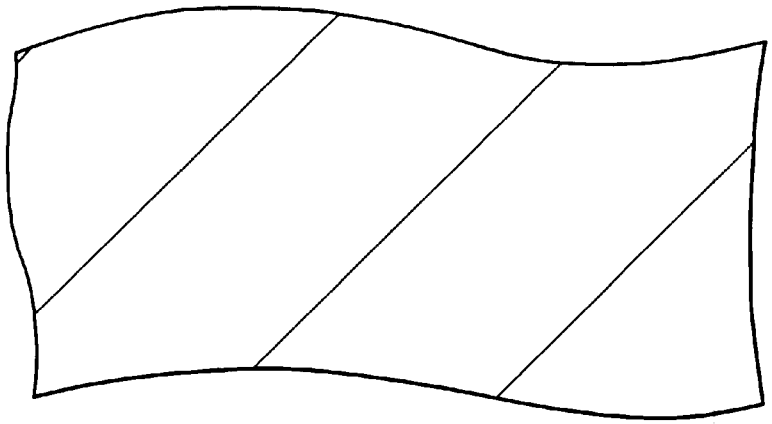
Figure 1O:
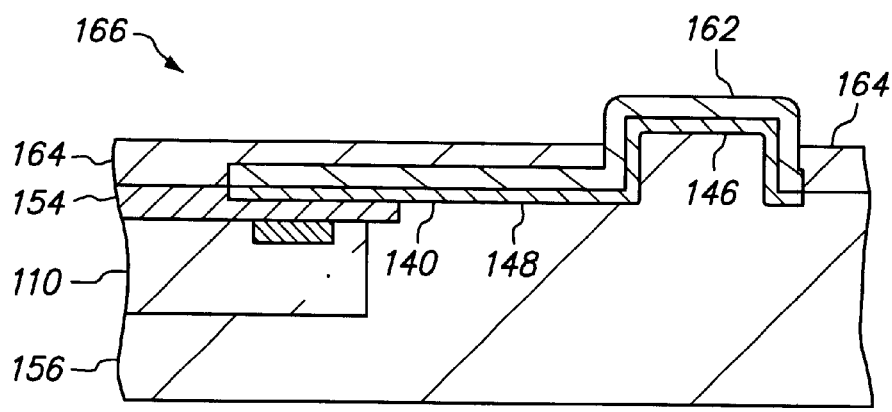
Figure 2O:
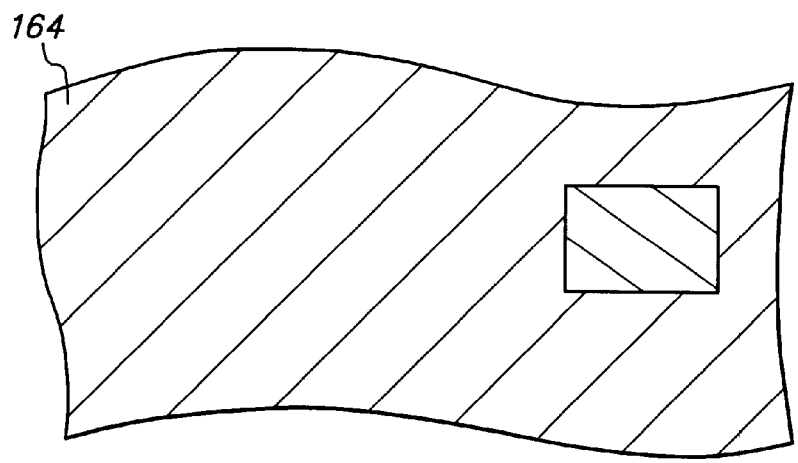
Figure 3O:
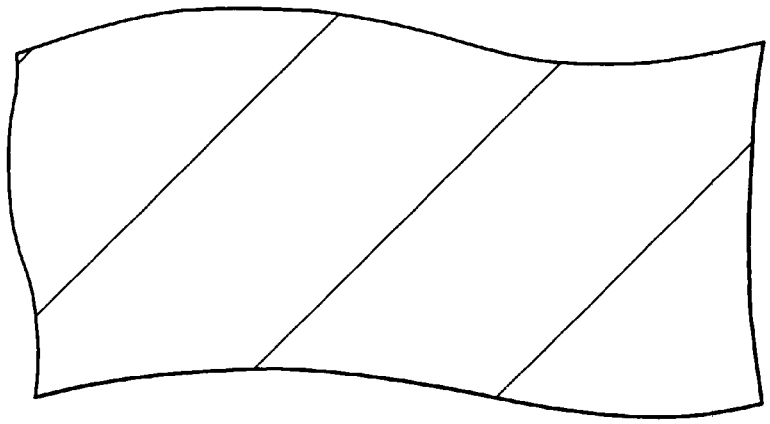
Figure 4A:
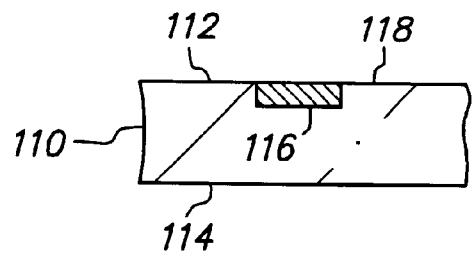
FIGS. 4A–4O are cross-sectional views corresponding to FIGS. 1A–1O, respectively.
Figure 4B:
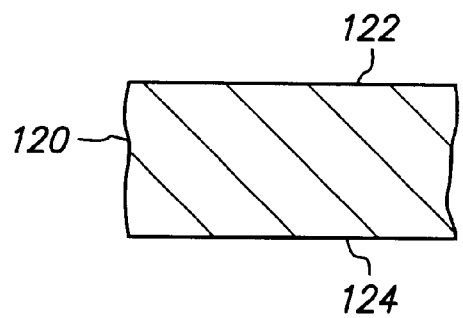
Figure 4C:
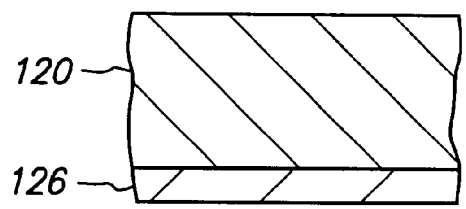
Figure 4D:
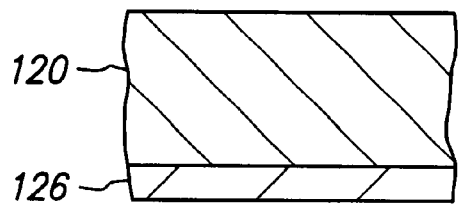
Figure 4E:
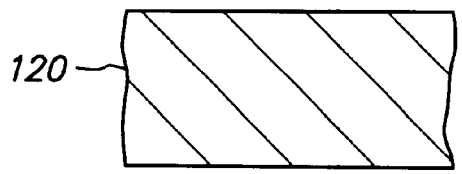
Figure 4F:
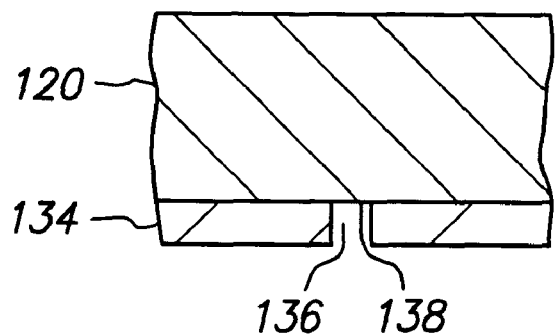
Figure 4G:
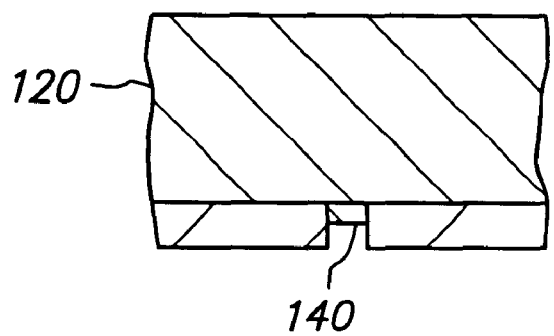
Figure 4H:
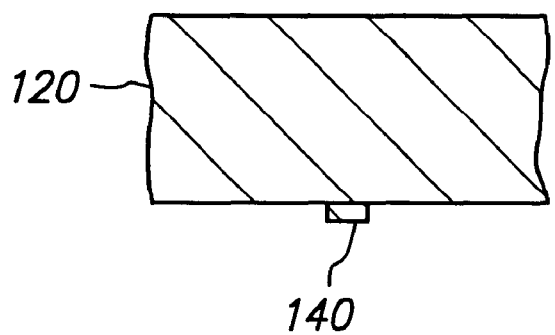
Figure 4I:
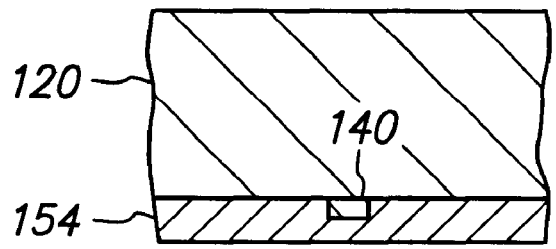
Figure 4J:
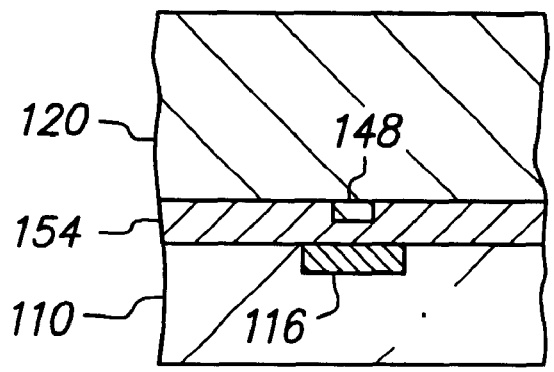
Figure 4K:
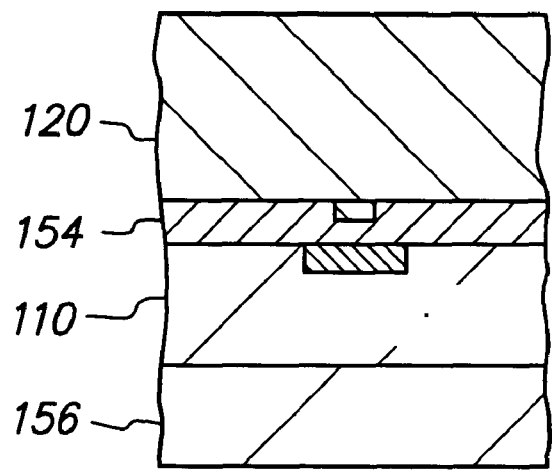
Figure 4L:
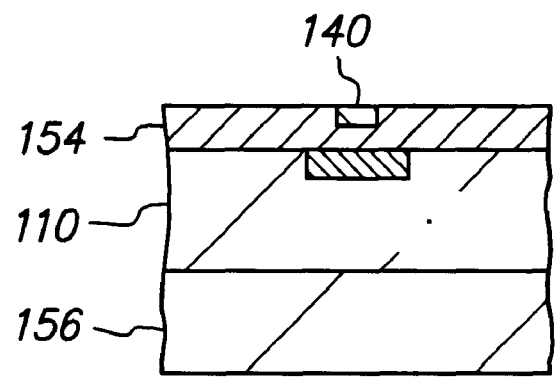
Figure 4M:
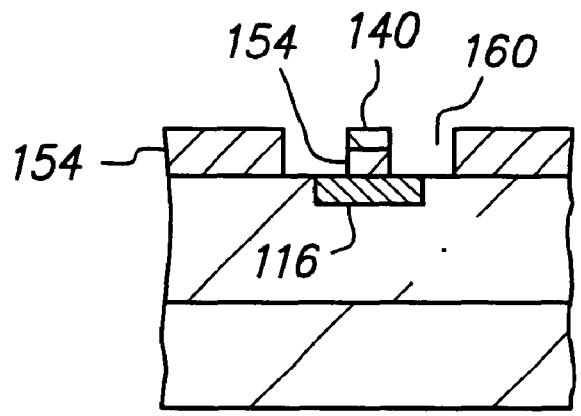
Figure 4N:
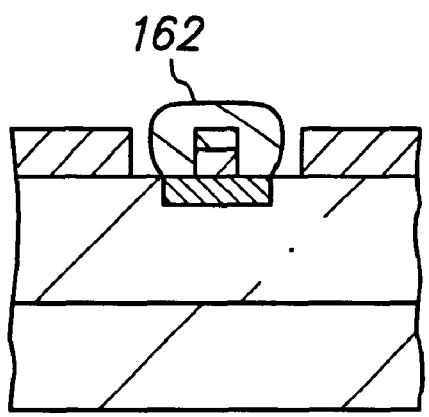
Figure 4O:
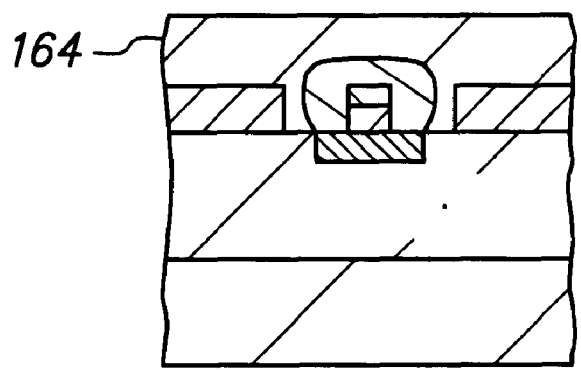
Figure 5A:
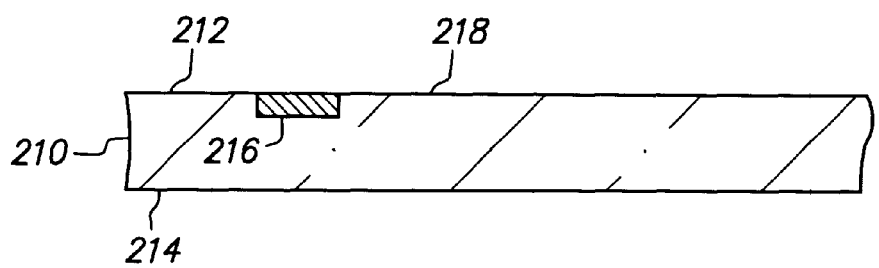
FIGS. 5A–5O are cross-sectional views showing a method of connecting a conductive trace to a semiconductor chip in accordance with a second embodiment of the present invention.
Figure 6A:
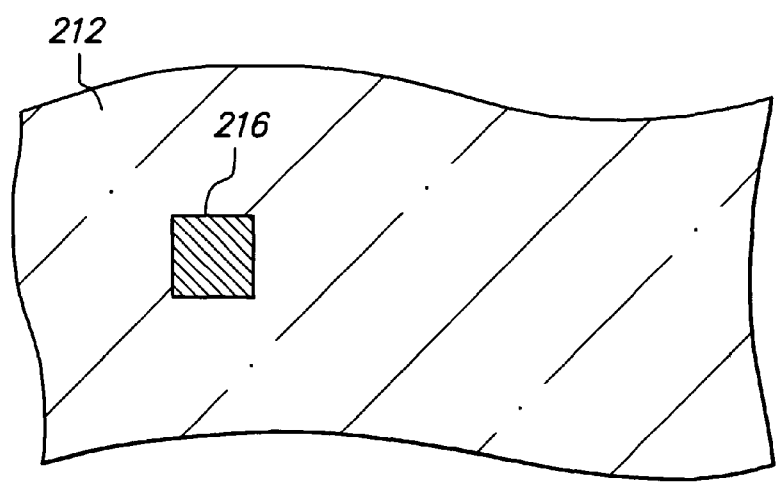
FIGS. 6A–6O are top plan views corresponding to FIGS. 5A–5O, respectively.
Figure 7A:
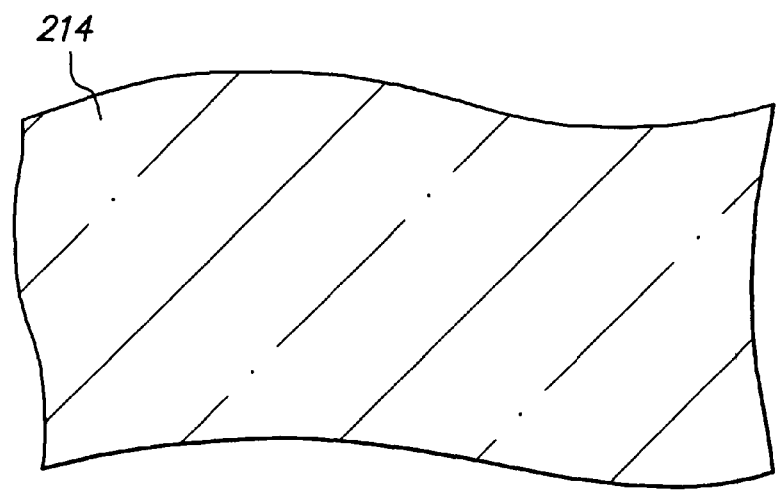
FIGS. 7A–7O are bottom plan views corresponding to FIGS. 5A–5O, respectively.
Figure 5B:
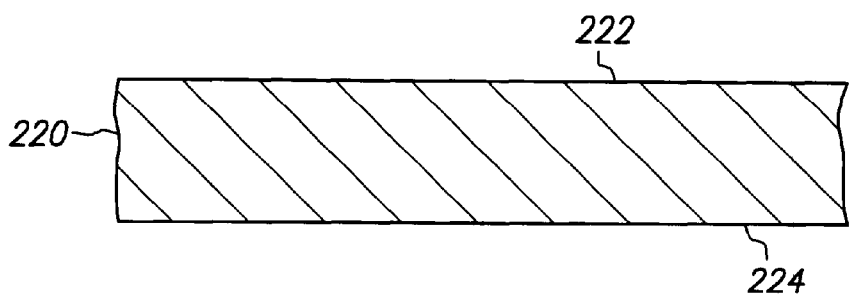
Figure 6B:
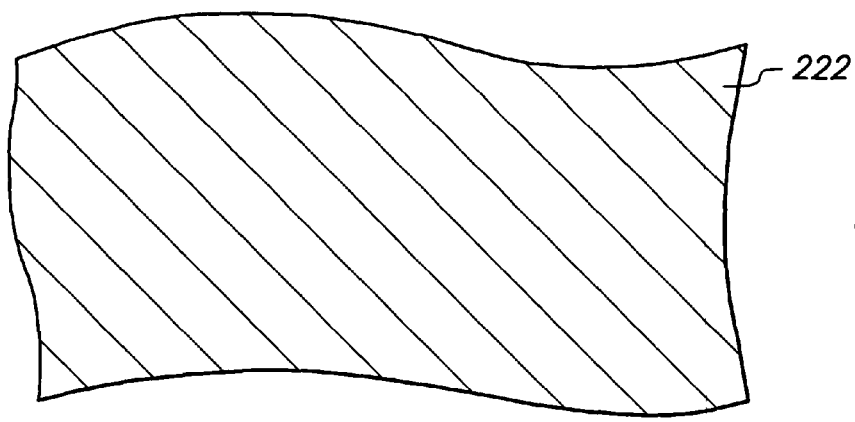
Figure 7B:
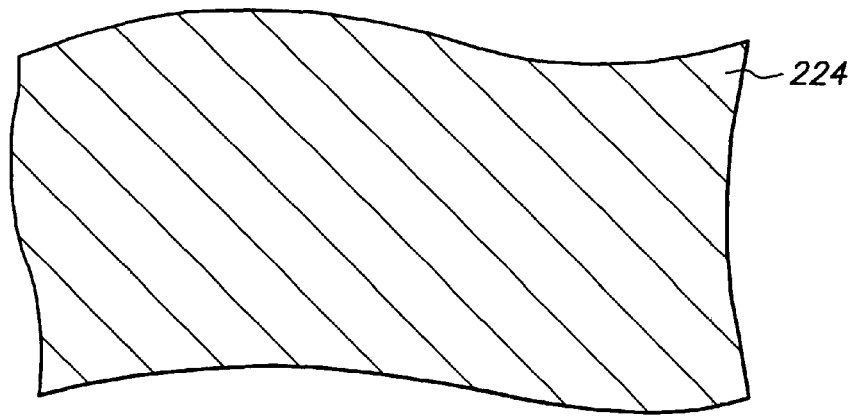
Figure 5C:
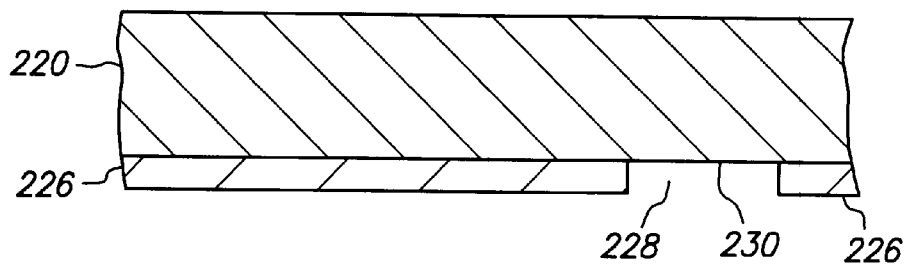
Figure 6C:
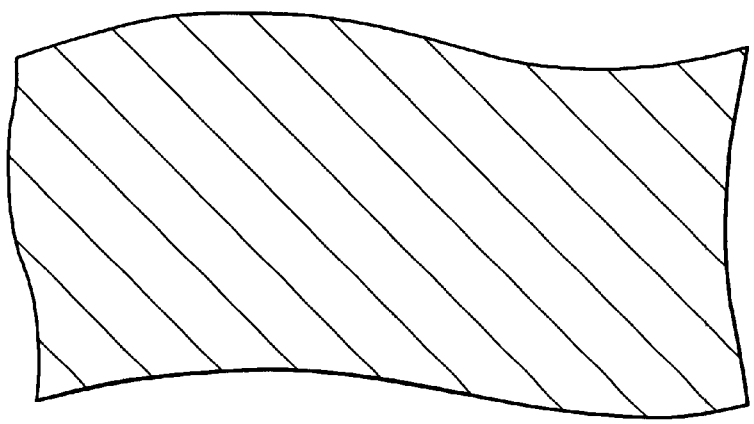
Figure 7C:
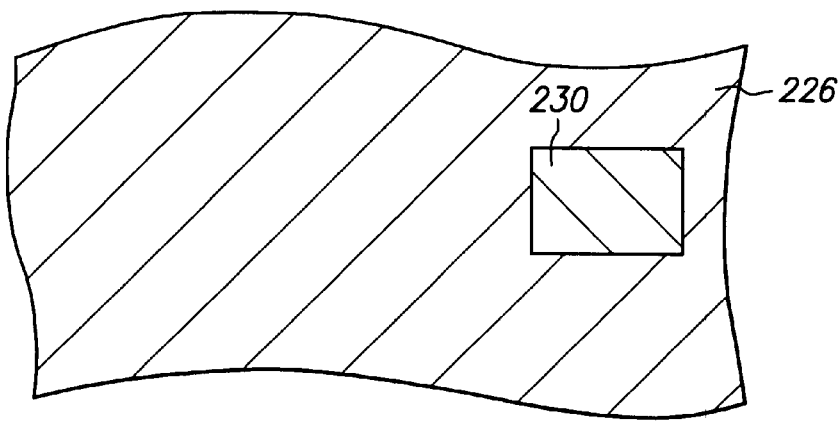
Figure 5D:
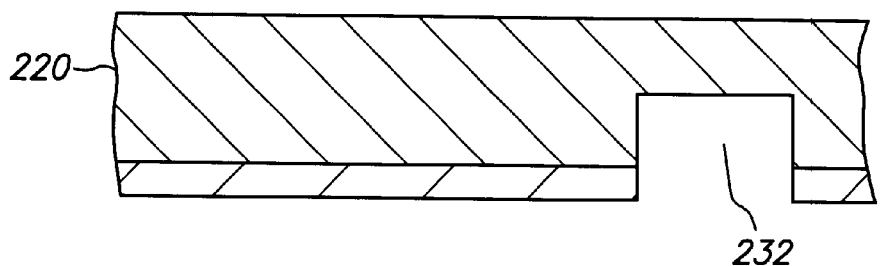
Figure 6D:
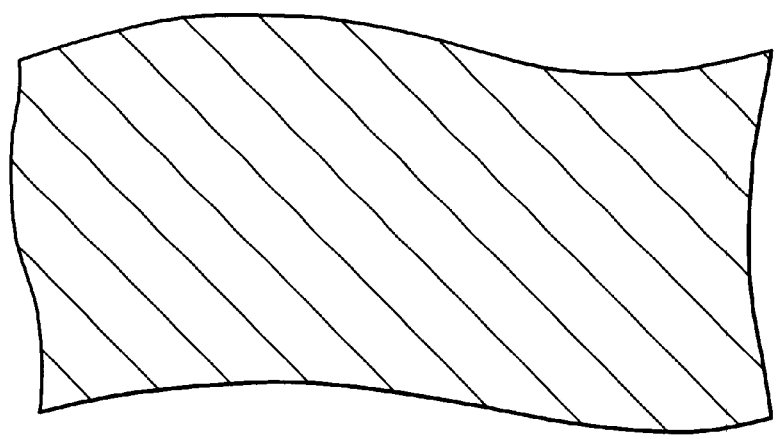
Figure 7D:
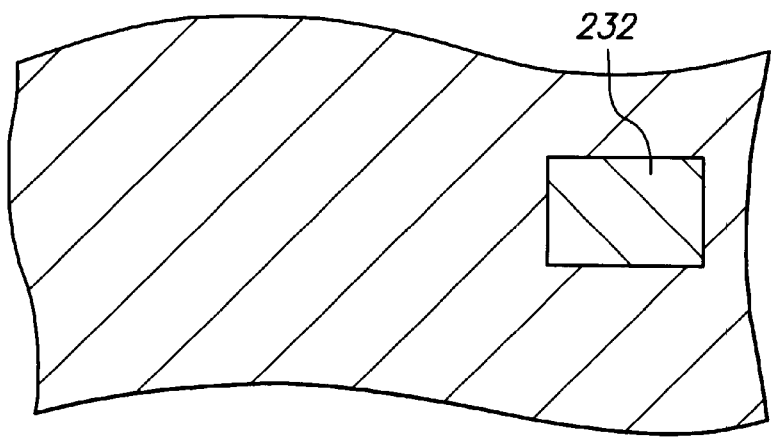
Figure 5E:
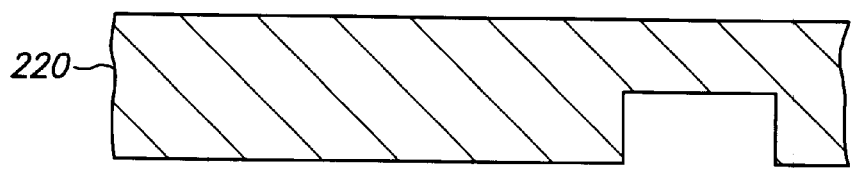
Figure 6E:
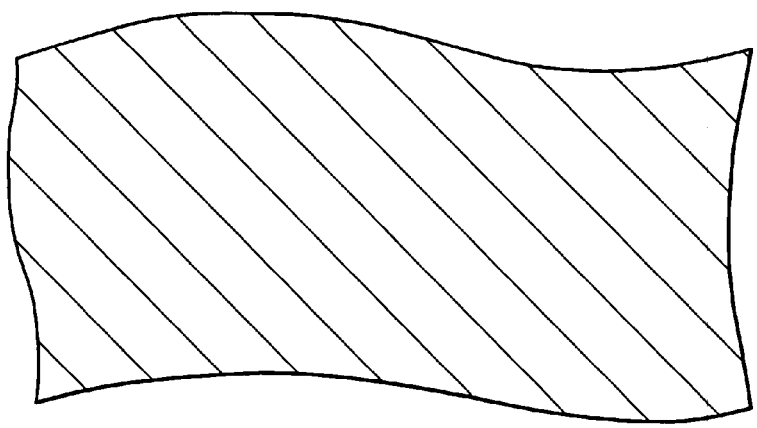
Figure 7E:
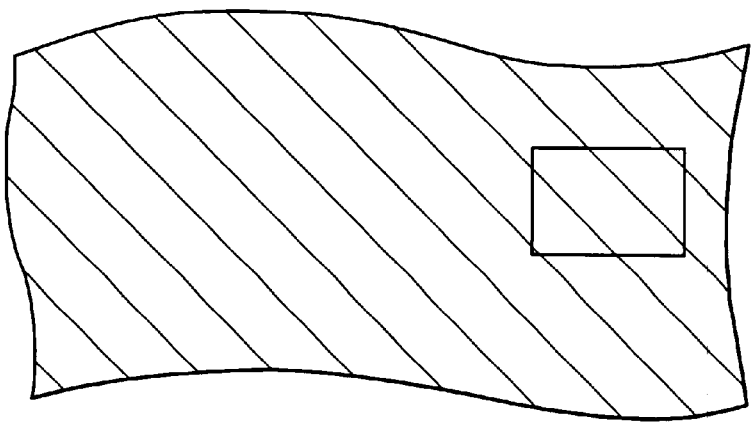
Figure 5F:
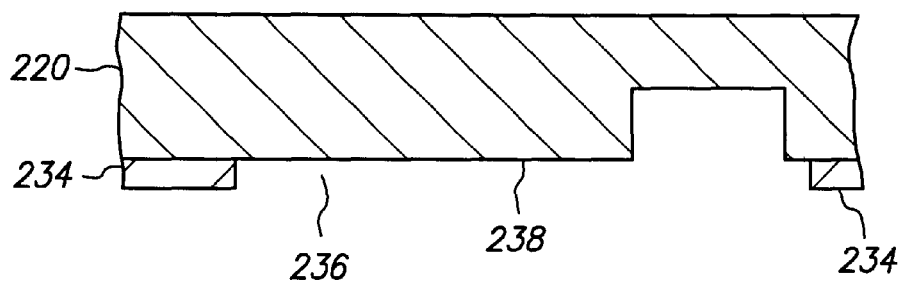
Figure 6F:
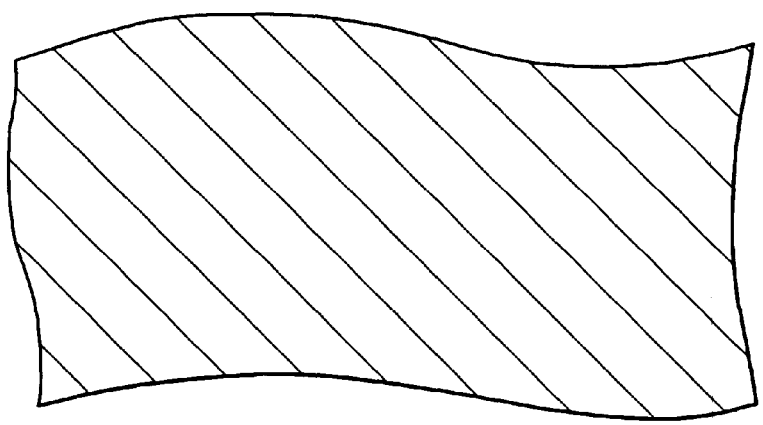
Figure 7F:
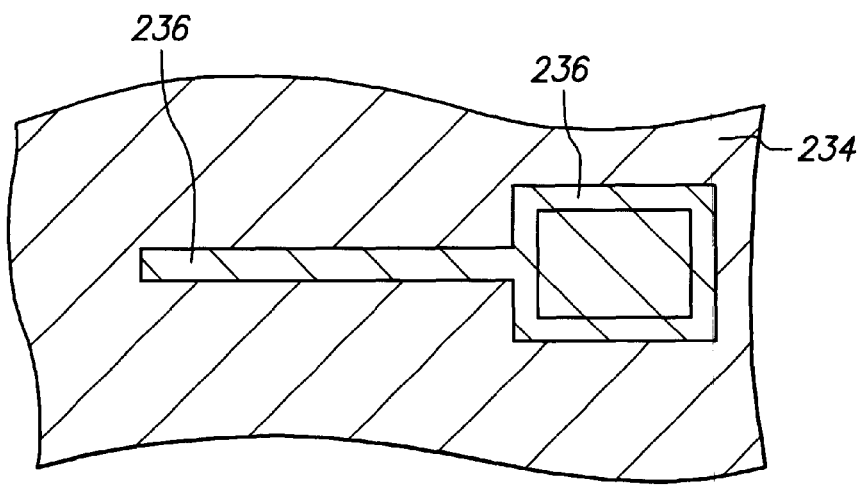
Figure 5G:
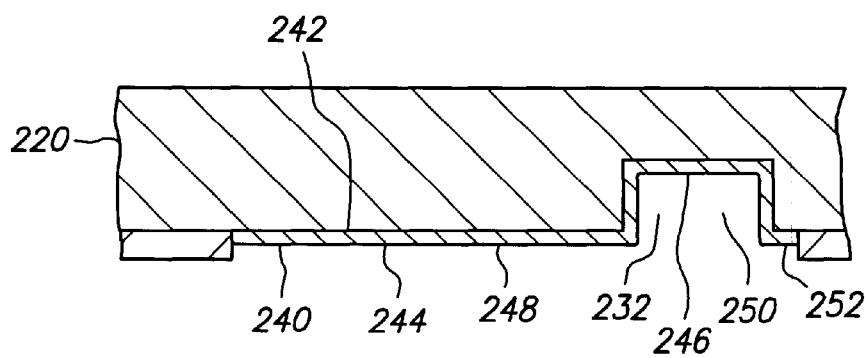
Figure 6G:
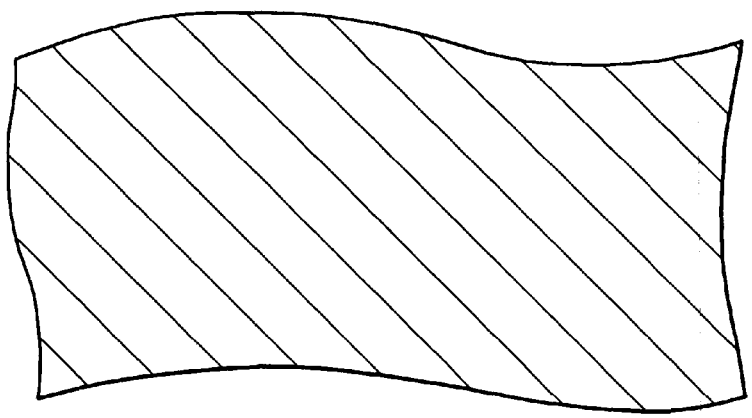
Figure 7G:
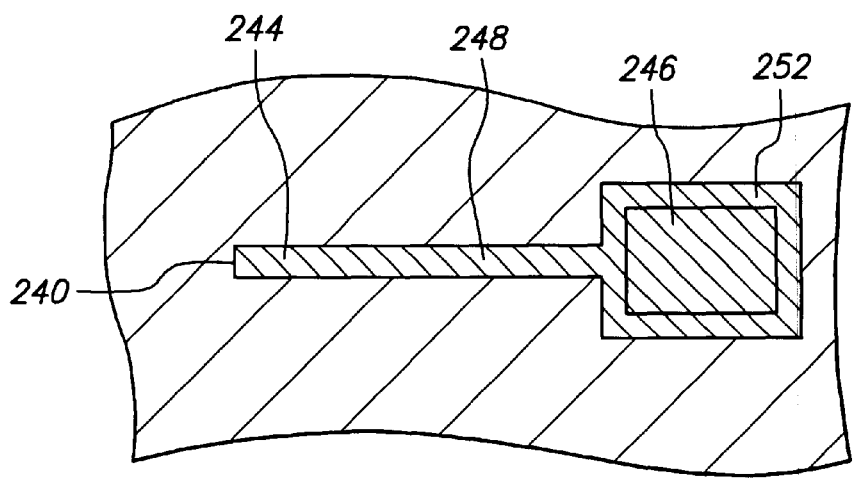
Figure 5H:
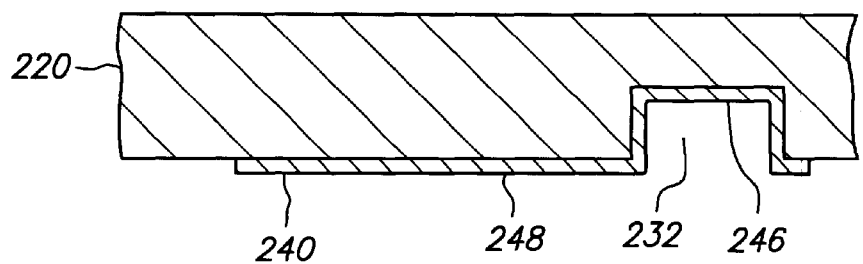
Figure 6H:
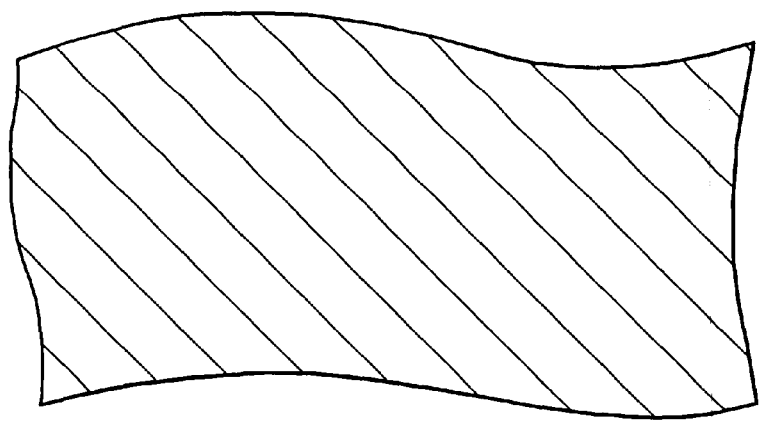
Figure 7H:
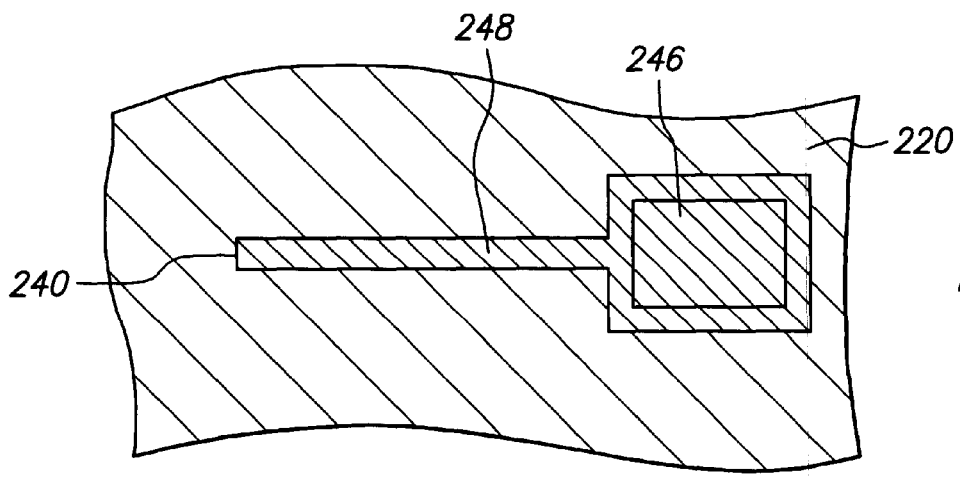
Figure 5I:
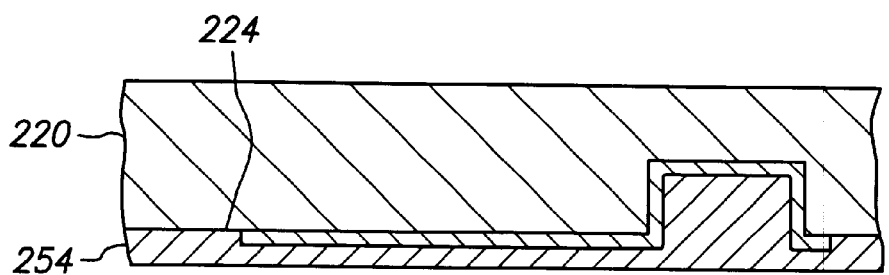
Figure 6I:
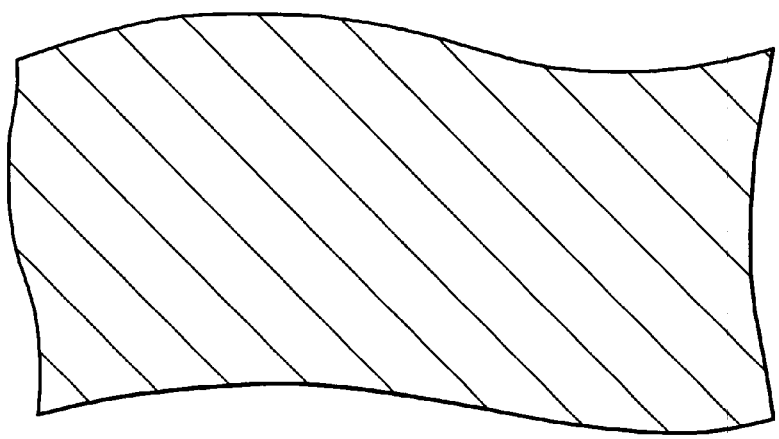
Figure 7I:
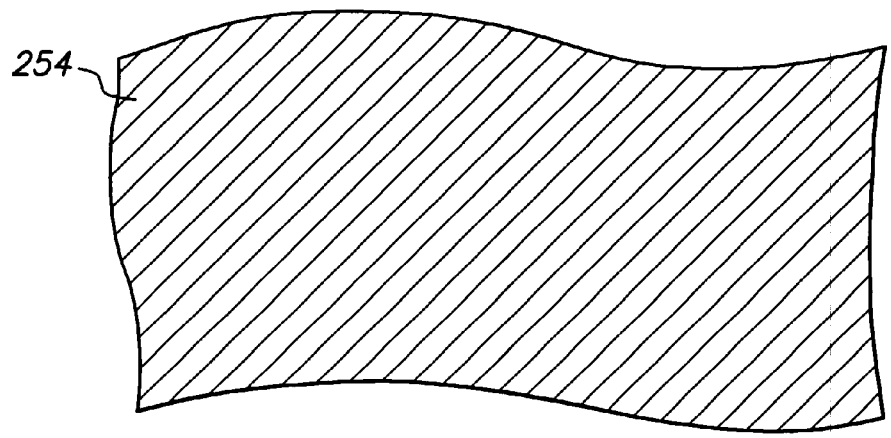
Figure 5J:
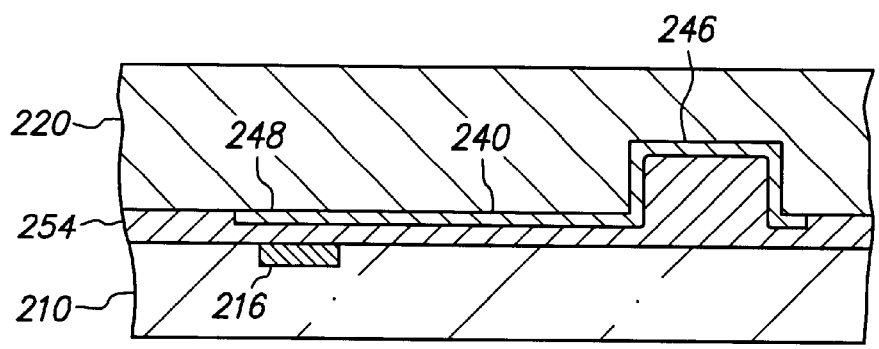
Figure 6J:
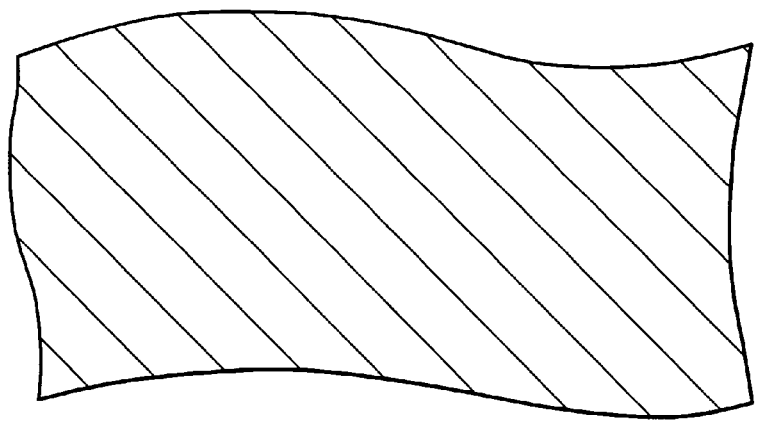
Figure 7J:
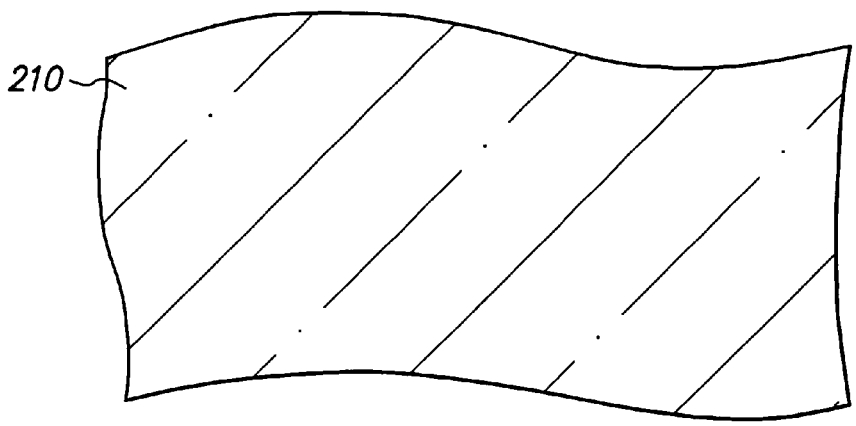
Figure 5K:
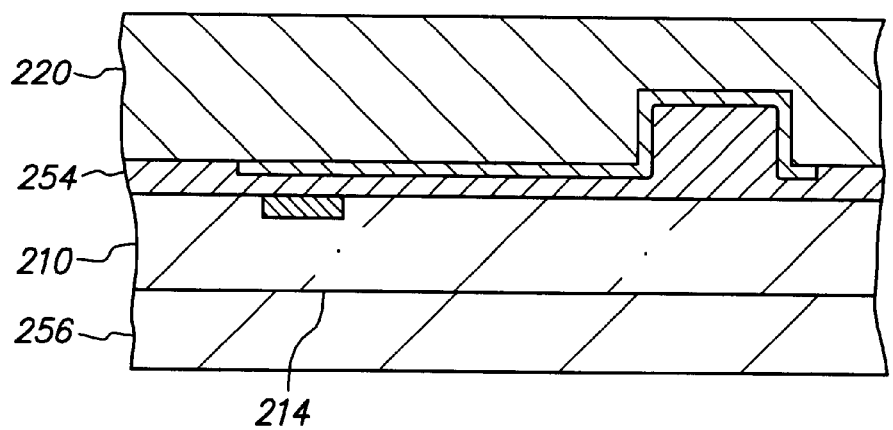
Figure 6K:
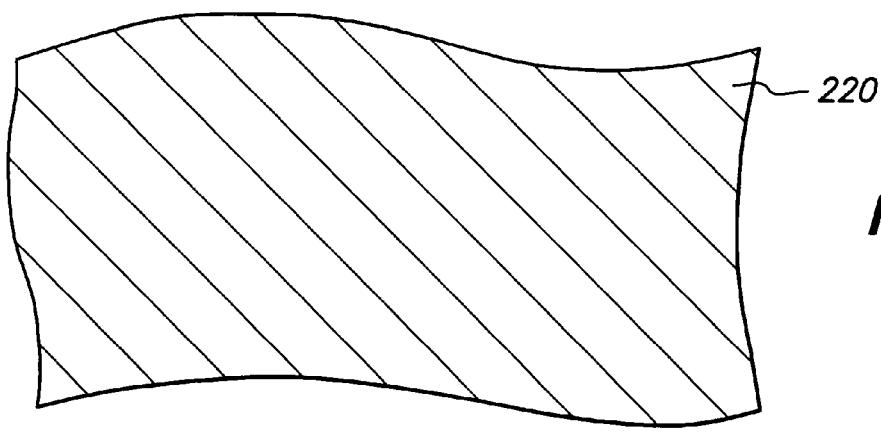
Figure 7K:
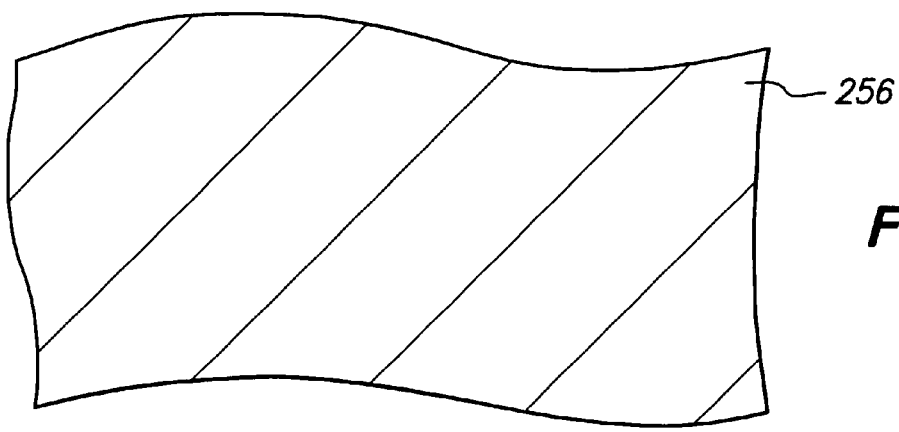
Figure 5L:
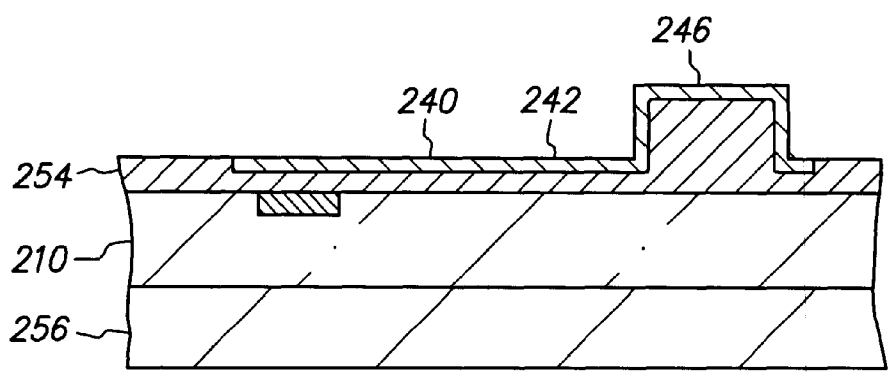
Figure 6L:
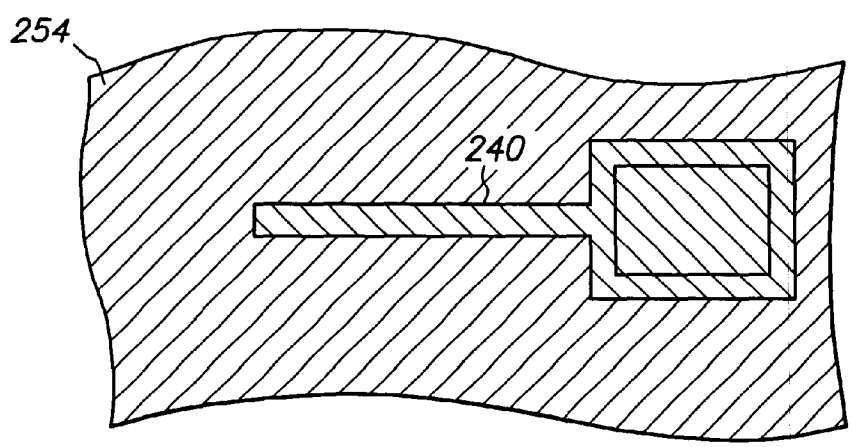
Figure 7L:
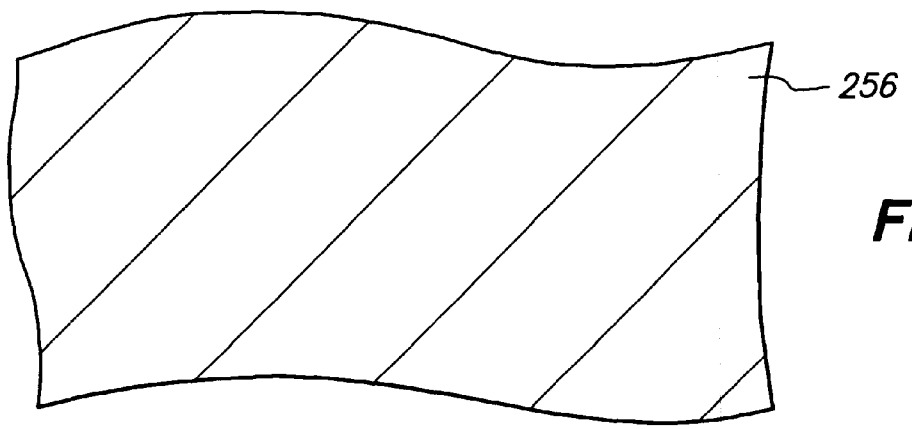
Figure 5M:
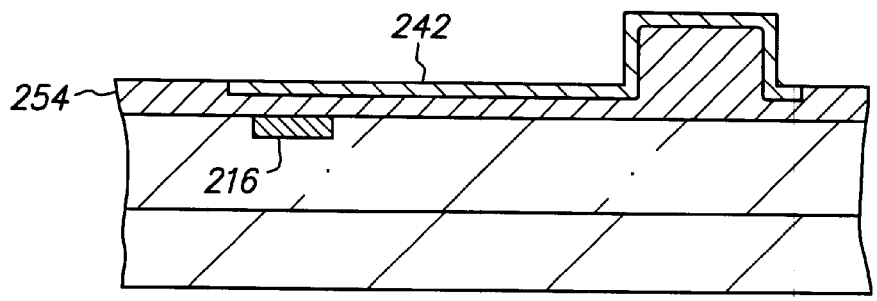
Figure 6M:
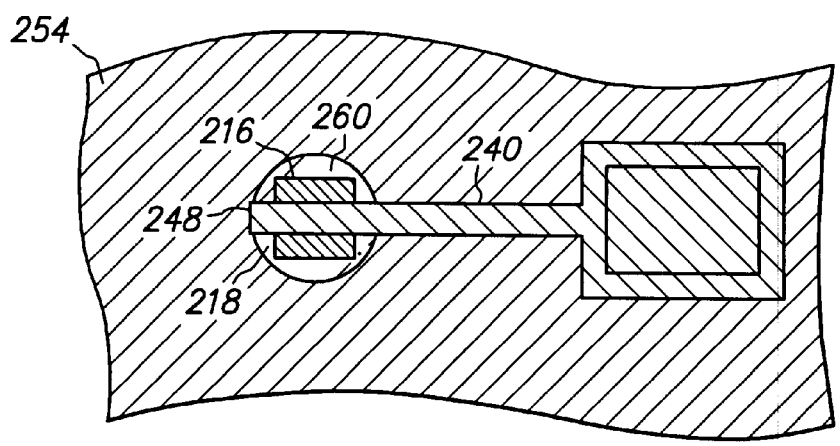
Figure 7M:
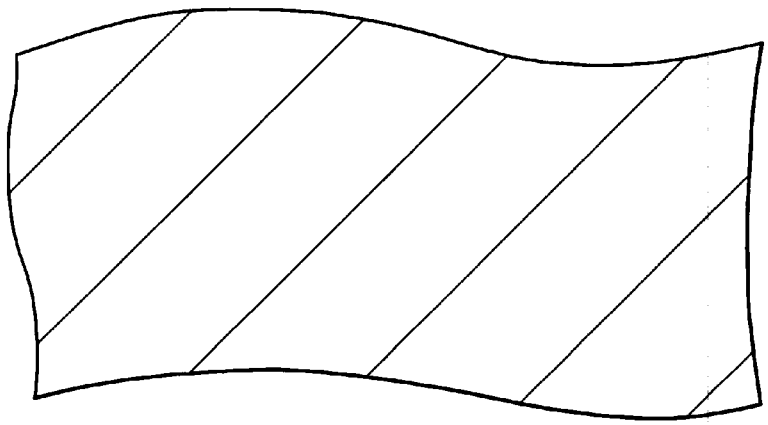
Figure 5N:
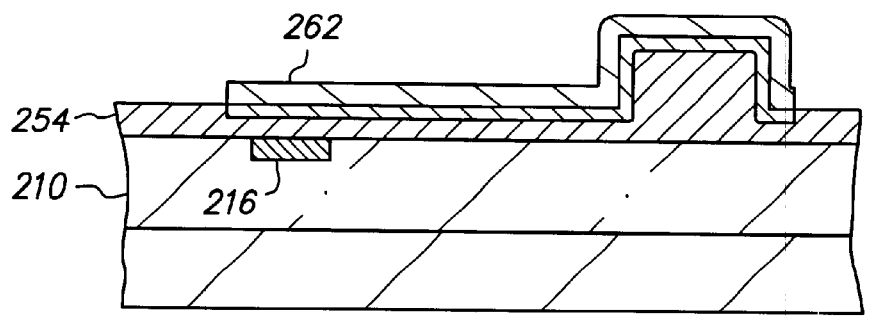
Figure 6N:
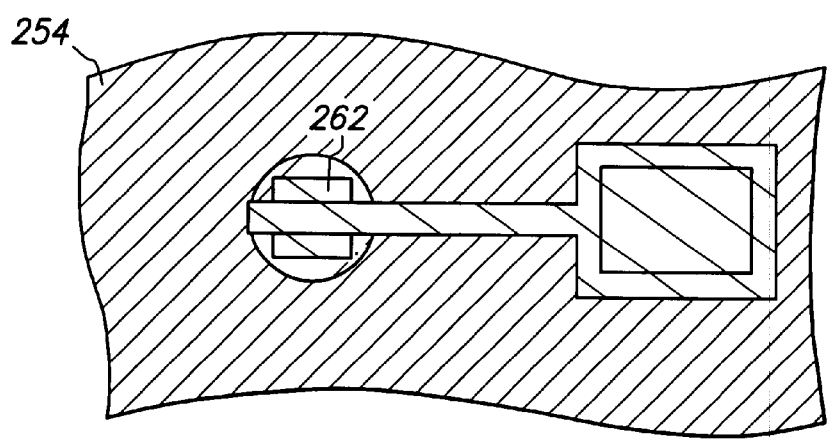
Figure 7N:
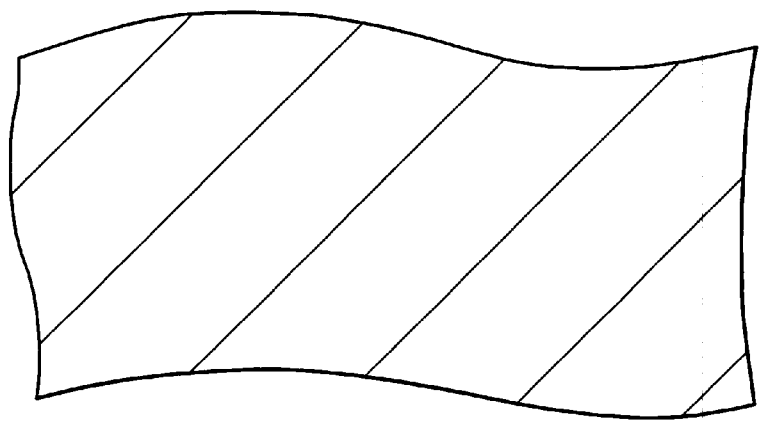
Figure 5O:
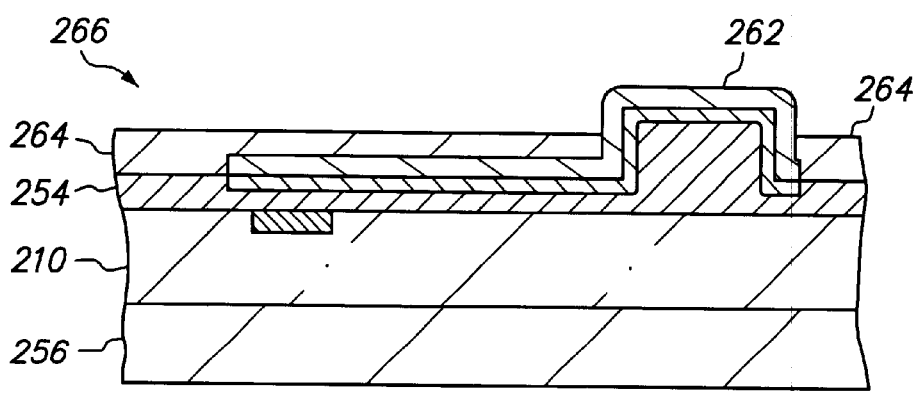
Figure 6O:
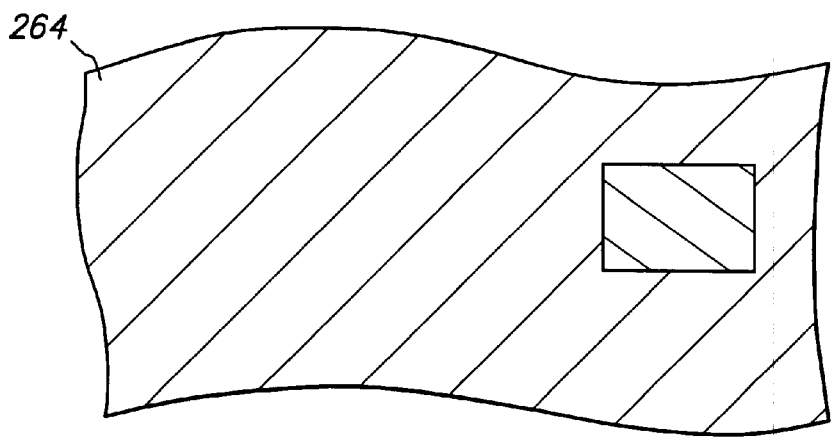
Figure 7O:
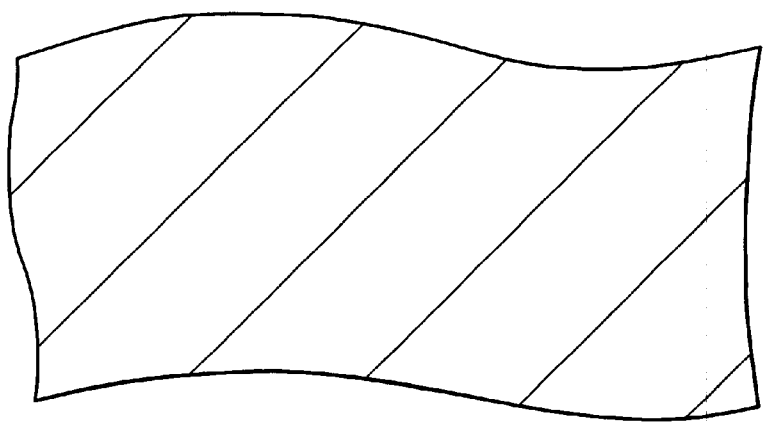

FIGS. 1A–1O, 2A–2O, 3A–3O and 4A–4O are cross-sectional, top, bottom and cross-sectional views, respectively, of a method of connecting a conductive trace to a semiconductor chip in accordance with a first embodiment of the present invention. FIGS. 4A–4O are oriented orthogonally with respect to FIGS. 1A–1O and depict FIGS. 1A–1O as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116 and passivation layer 118. Pad 116 is substantially aligned with passivation layer 118 so that upper surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water. Thereafter, pad 116 is rendered catalytic to electrolessly plated nickel. Pad 116 can be rendered catalytic to electroless nickel by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pad 116 can be rendered catalytic to electroless nickel by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, a nickel surface layer is electrolessly deposited on the zincated aluminum base, and the nickel surface layer is catalytic to electroless nickel.

Chip 110 includes many other pads on upper surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of base 120 which includes top surface 122 and bottom surface 124. Base 120 is a copper foil with a thickness of 150 microns.

FIGS. 1C, 2C, 3C and 4C are cross-sectional, top, bottom and cross-sectional views, respectively, of photoresist layer 126 formed on bottom surface 124 of base 120. Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains opening 128 that selectively exposes portion 130 of bottom surface 124. Photoresist layer 126 has a thickness of 15 microns.

FIGS. 1D, 2D, 3D and 4D are cross-sectional, top, bottom and cross-sectional views, respectively, of recess 132 formed in base 120. Recess 132 is formed by applying a "back-side" wet chemical etch to exposed portion 130 of bottom surface 124 without applying the wet chemical etch to the opposite or front-side (top surface 122) of base 120. For instance, the wet chemical etch can be sprayed on the back-side, or the front-side can be covered by a mask and then the structure can be dipped in the wet chemical etch. Thus, recess 132 is formed subtractively. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride.

The wet chemical etch does not etch completely through base 120. Rather, the wet chemical etch etches partially through base 120. In this instance, the wet chemical etch removes 75 microns from base 120 at recess 132. Since base 120 is 150 microns thick, recess 132 has a depth of 75 microns and is covered by the unetched 75 micron thick upper portion of base 120. Thus, recess 132 extends to bottom surface 124. Recess 132 has a length of 300 microns and a width of 150 microns. The optimal etch time for exposing portion 130 of bottom surface 124 to the wet chemical etch in order to form recess 132 with the desired dimensions can be established through trial and error.

FIGS. 1E, 2E, 3E and 4E are cross-sectional, top, bottom and cross-sectional views, respectively, of base 120 after photoresist layer 126 is stripped.

FIGS. 1F, 2F, 3F and 4F are cross-sectional, top, bottom and cross-sectional views, respectively, of photoresist layer 134 formed on bottom surface 124 of base 120. Photoresist layer 134 is deposited as a continuous layer and then patterned by selectively applying light through a reticle (not shown), applying a developer solution to remove the photoresist portions rendered soluble by the light, and then hard baking, as is conventional. As a result, photoresist layer 134 contains opening 136 that selectively exposes portion 138 of bottom surface 124. Photoresist layer 134 has a thickness of 15 microns.

FIGS. 1G, 2G, 3G and 4G are cross-sectional, top, bottom and cross-sectional views, respectively, of conductive trace 140 formed on base 120. Conductive trace 140 includes top surface 142, bottom surface 144, bumped terminal 146 and routing line 148. Top surface 142 contacts and is covered by base 120, and bottom surface 144 faces away from base 120 and is exposed. Bumped terminal 146 is formed in recess 132, and routing line 148 is formed outside recess 132. As a result, bumped terminal 146 extends above routing line 148. Bumped terminal 146 includes or defines cavity 150 that extends into and faces away from base 120 and is exposed, and routing line 148 includes enlarged rectangular portion 152 that is contiguous with and surrounds bumped terminal 146. Conductive trace 140 is composed of gold and has a thickness of 5 microns, bumped terminal 146 has a length of 300 microns, a width of 150 microns and a height of 75 microns, routing line 148 has a width of 40 microns, and enlarged rectangular portion 152 has a length of 340 microns and a width of 190 microns.

Conductive trace 140 is formed by an electroplating operation. Thus, conductive trace 140 is formed additively. Initially, a plating bus (not shown) is connected to base 120, current is applied to the plating bus from an external power source, and base 120 is submerged in an electrolytic gold plating bath such as Technic Orotemp at room temperature. As a result, conductive trace 140 electroplates (or grows) on exposed portion 138 of bottom surface 124 of base 120. The electroplating operation continues until conductive trace 140 has the desired thickness. Thereafter, the structure is removed from the electrolytic bath and rinsed in distilled water to remove contaminants.

FIGS. 1H, 2H, 3H and 4H are cross-sectional, top, bottom and cross-sectional views, respectively, of base 120 and conductive trace 140 after photoresist layer 134 is stripped. At this stage, conductive trace 140 remains attached to base 120, top surface 142 remains covered by base 120, bumped terminal 146 remains embedded in recess 132, and the outer edges of routing line 148 are exposed.

FIGS. 1I, 2I, 3I and 4I are cross-sectional, top, bottom and cross-sectional views, respectively, of adhesive 154 formed on base 120 and conductive trace 140. Adhesive 154 is an insulative thermoplastic polyimide film with a glass transition temperature (Tg) of 400° C. Adhesive 154 is applied to portions of bottom surface 124 of base 120 and bottom surface 144 of conductive trace 140 as a liquid resin such as polyamic acid using stencil printing. As a result, the liquid resin flows over the outer edges of conductive trace 140. However, the liquid resin does not contact bumped terminal 146. Thereafter, the liquid resin is cured to form adhesive 154 as a polyimide film that extends 15 microns beneath bottom surface 124 and 10 microns beneath bottom surface 144.

FIGS. 1J, 2J, 3J and 4J are cross-sectional, top, bottom and cross-sectional views, respectively, of chip 110 mechanically attached to conductive trace 140 by adhesive 154. Adhesive 154 is disposed between and contacts upper surface 112 of chip 110 and bottom surface 124 of base 120, and likewise, adhesive 154 is disposed between and contacts upper surface 112 of chip 110 and bottom surface 144 of conductive trace 140. Thus, chip 110 and base 120 do not contact one another, and chip 110 and conductive trace 140 do not contact one another. Preferably, adhesive 154 is sandwiched between upper surface 112 and bottom surface 124, and between upper surface 112 and bottom surface 144, using relatively low pressure while adhesive 154 is heated to its glass transition temperature and becomes molten. In addition, chip 110 and conductive trace 140 are positioned relative to one another so that routing line 148 is disposed above and overlaps and is electrically isolated from pad 116, routing line 148 extends across the outer edge of chip 110 near pad 116, and bumped terminal 146 is outside the periphery of chip 110. Chip 110 and conductive trace 140 can be aligned using an automated pattern recognition system. Thereafter, adhesive 154 is cooled and solidifies to form a solid adhesive layer that is 10 microns thick between upper surface 112 and bottom surface 144 and mechanically fastens chip 110 to conductive trace 140.

At this stage, conductive trace 140 is covered from above by base 120, the portion of conductive trace 140 within and slightly outside the periphery of chip 110 is covered from below by adhesive 154, the portion of conductive trace 140 more than slightly outside the periphery of chip 110 is not covered from below, pad 116 is covered from above by adhesive 154, and pad 116 is separated from routing line 148 by the thickness of adhesive 154.

FIGS. 1K, 2K, 3K and 4K are cross-sectional, top, bottom and cross-sectional views, respectively, of encapsulant 156 formed on chip 110, base 120 and conductive trace 140 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 156 contacts lower surface 114 of chip 110, the outer edges of chip 110, and portions of bottom surface 124 of base 120 and bottom surface 144 of conductive trace 140 that extend beyond the periphery of chip 110 and are not covered by adhesive 154. Encapsulant 156 also extends into the remaining space in recess 132 and fills cavity 150. Encapsulant 156 is a solid adherent compressible protective layer with a thickness of 100 microns beneath lower surface 114 of chip 110 that provides backside environmental protection such as moisture resistance and particle protection for chip 110 as well as mechanical support for bumped terminal 146.

FIGS. 1L, 2L, 3L and 4L are cross-sectional, top, bottom and cross-sectional views, respectively, of chip 110 and conductive trace 140 after base 120 is removed. A "frontside" wet chemical etch is applied to top surface 122 of base 120. For instance, the wet chemical etch can be sprayed on top surface 122, or the structure can be dipped in the wet chemical etch since chip 110 is protected by encapsulant 156. The wet chemical etch is highly selective of copper with respect to gold, polyimide and the molding compound. Therefore, no appreciable amount of conductive trace 140, adhesive 154 or encapsulant 156 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing base 120 to the wet chemical etch in order to completely remove base 120 without excessively exposing conductive trace 140 to the wet chemical etch can be established through trial and error. Advantageously, since the wet chemical etch is not selective of gold, there is a wide window of acceptable etch times and little or no endpoint concern.

The wet chemical etch completely removes base 120. As a result, the entire top surface 142 of conductive trace 140 is exposed. At this stage, adhesive 154 continues to cover pad 116, and encapsulant 156 provides critical mechanical support for bumped terminal 146. Furthermore, the compressibility of encapsulant 156 permits bumped terminal 146 to provide a compressible, compliant contact terminal. That is, bumped terminal 146 exhibits elastic deformation in response to vertically oriented external pressure applied to bumped terminal 146 in the direction from top surface 142 towards bottom surface 144. As a result, bumped terminal 146 provides excellent vertical compliance for the next level assembly.

FIGS. 1M, 2M, 3M and 4M are cross-sectional, top, bottom and cross-sectional views, respectively, of opening 160 formed in adhesive 154 that exposes pad 116. Opening 160 can be provided by applying a suitable etch that is highly selective of adhesive 154 with respect to pad 116 and conductive trace 140. The preferred etch depends on the thickness of adhesive 154.

In this instance, a selective laser etch is applied. Using projection laser ablation, a metal mask (not shown) is positioned above top surface 142 such that an opening in the metal mask is aligned with pad 116, and a laser is directed to the side of the metal mask opposite top surface 142. Accordingly, the metal mask targets the laser at pad 116. The laser removes a portion of adhesive 154 above pad 116 and outside conductive trace 140 as well as a portion of adhesive 154 slightly outside the periphery of pad 116 such that opening 160 has a diameter of 100 microns and pad 116 (with a length and width of 70 microns) is axially centered within opening 160. Routing line 148 shields the underlying adhesive 154 from the laser etch so that the portion of adhesive 154 sandwiched between routing line 148 and pad 116 remains intact. Opening 160 is formed in adhesive 154 without damaging pad 116, passivation layer 118 or conductive trace 140.

FIGS. 1N, 2N, 3N and 4N are cross-sectional, top, bottom and cross-sectional views, respectively, of connection joint 162 formed on routing line 148 and pad 116 by electroless plating.

Electroless plating provides metal deposition by an exchange reaction between metal complexes in a solution and a catalytic metal that activates or initiates the reaction.

As a result, the electroless metal continually plates (i.e., deposits or grows) on the catalytic metal. Advantageously, the reaction does not require externally applied electric current. Therefore, electroless plating can proceed without a plating bus.

In order to initiate electroless deposition of connection joint 162, the partially completed assembly is dipped in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The nickel is amorphous and does not deposit on passivation layer 118, adhesive 154 or encapsulant 156 and therefore a mask is not necessary. Conductive trace 140 is composed of gold which is catalytic to electroless nickel, and pad 116 has already been rendered catalytic to electroless nickel. Therefore, connection joint 162 initially includes a first portion that begins to plate on pad 116 and a second portion that begins to plate on conductive trace 140, although the first and second connection joint portions do not contact one another and pad 116 remains electrically isolated from conductive trace 140. However, as the electroless plating operation continues, and the connection joint portions continue to plate, the connection joint portions contact one another and metallurgically merge into a single connection joint 162 that electrically connects pad 116 and conductive trace 140. At this point, connection joint 162 is primarily nickel and contains about 4 to 9 weight percentage phosphorus and is 20 microns thick.

Thereafter, the assembly is removed from the electroless nickel plating solution and briefly submerged in an electroless gold plating solution such as is MacDermid PLANAR™ at 70° C. Advantageously, the gold deposits on the nickel without depositing on passivation layer 118, adhesive 154 or encapsulant 156 and therefore a mask is not necessary. The gold surface layer is relatively thin, with a thickness on the order of 0.3 microns. Thus, connection joint 162 consists of a 20 micron thick buried nickel layer covered by a 0.3 micron thick gold surface layer. For convenience of illustration, the buried nickel layer and the gold surface layer are shown as a single layer. The buried nickel layer provides the primary mechanical and electrical connection for connection joint 162, and the gold surface layer provides a wettable surface for bumped terminal 146. To elaborate, the gold surface layer provides wetting for bumped terminal 146 so that a solder ball (not shown) can be subsequently deposited on bumped terminal 146 and reflowed during the next level assembly but is of relatively little importance to connection joint 162. Thereafter, the assembly is removed from the electroless gold plating solution and rinsed in distilled water.

Connection joint 162 is formed in opening 160 in adhesive 154 and contacts and electrically connects pad 116 and conductive trace 140. Connection joint 162 contacts and covers portions of pad 116 beneath opening 160 and outside conductive trace 140, and the top surface and vertical sidewalls of the portion of conductive trace 140 that overlaps pad 116. Thus, connection joint 162 provides a robust, permanent electrical connection between pad 116 and conductive trace 140. Connection joint 162 is the only electrical conductor external to chip 110 that contacts pad 116, adhesive 154 and connection joint 162 are the only materials external to chip 110 that contact pad 116, and adhesive 154 and connection joint 162 are the only materials that contact both pad 116 and conductive trace 140.

FIGS. 1O, 2O, 3O and 4O are cross-sectional, top, bottom and cross-sectional views, respectively, of insulative base 164 formed on conductive trace 140, adhesive 154, encapsulant 156 and connection joint 162. Insulative base 164 is relatively flat and has a thickness of 50 microns. Although insulative base 164 covers routing line 148, adhesive 154, encapsulant 156, connection joint 162 and a lower portion of bumped terminal 146, an upper portion of bumped terminal 146 extends above insulative base 164. Preferably, insulative base 164 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over routing line 148, adhesive 154, encapsulant 156, connection joint 162 and the lower portion of bumped terminal 146 but not the upper portion of bumped terminal 146 using screen printing, and then the epoxy is cured or hardened at relatively low temperature in the range of 100–250° C. to form a solid adherent insulative layer that provides additional mechanical strength for conductive trace 140 and protection for connection joint 162. For instance, if a solder joint is subsequently formed on bumped terminal 146 during the next level assembly, insulative base 164 protects the underlying metallization from unwanted solder reflow.

At this stage, the manufacture of semiconductor chip assembly 166 that includes chip 110, conductive trace 140, adhesive 154, encapsulant 156, connection joint 162 and insulative base 164 can be considered complete. Conductive trace 140 is mechanically and electrically coupled to chip 110 by adhesive 154 and connection joint 162, respectively. Conductive trace 140 extends beyond an outer edge of chip 110 and provides horizontal fan-out routing (via routing line 148) and vertical routing (via bumped terminal 146) between pad 116 and external circuitry. Advantageously, conductive trace 140 is a single continuous low-profile metal segment. Encapsulant 156 and insulative base 164 provide mechanical support and environmental protection.

The semiconductor chip assembly includes other conductive traces embedded in adhesive 154, and only a single conductive trace 140 is shown for convenience of illustration. The conductive traces are each connected to a respective pad on chip 110 by a respective connection joint. Furthermore, the conductive traces each extend across an outer edge of chip 110 near their respective pads and contain a bumped terminal at a distal end outside the periphery of chip 110 to provide horizontal fan-out routing and vertical routing for their respective pads. The conductive traces are electrically isolated from one another by adhesive 154 after base 120 is removed. Advantageously, since base 120 provides a plating bus for forming the conductive traces, and the connection joints are formed by electroless plating, there is no plating bus or related circuitry that need be disconnected or severed from chip 110 or the conductive traces after base 120 is removed and the connection joints are formed. If desired, solder balls can be screen printed on the tops of the bumped terminals to provide connections to the next level assembly.

Figure 8A:
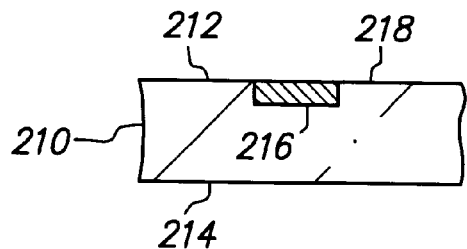
FIGS. 8A–8O are cross-sectional views corresponding to FIGS. 5A–5O, respectively.
Figure 8B:
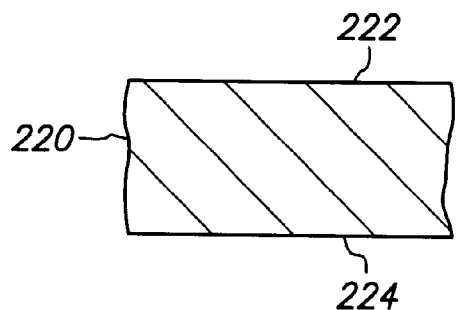
Figure 8C:
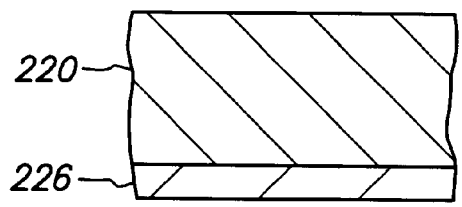
Figure 8D:
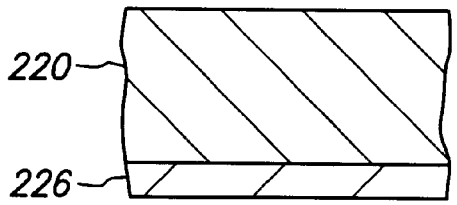
Figure 8E:
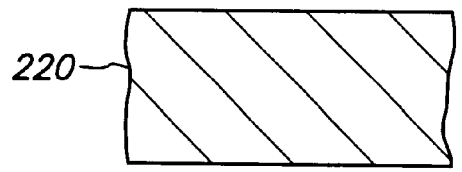
Figure 8F:
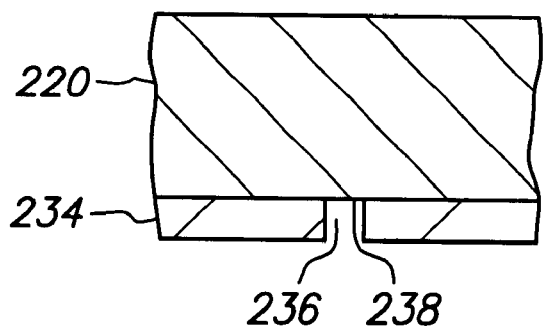
Figure 8G:
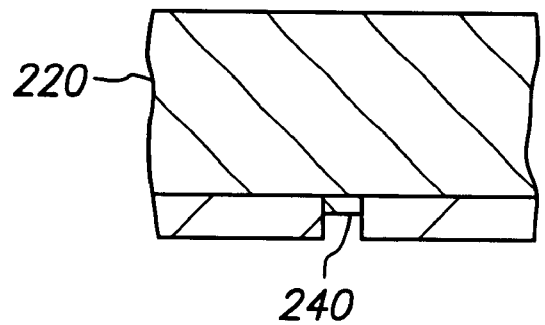
Figure 8H:
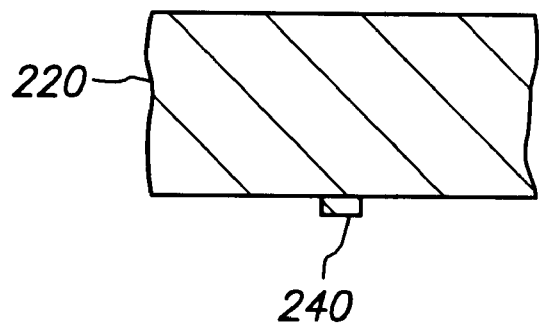
Figure 8I:
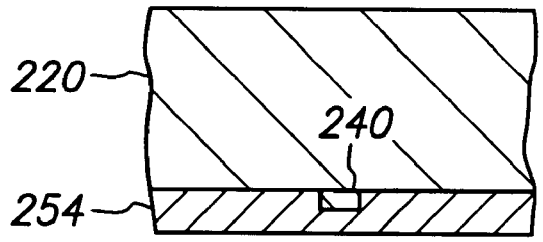
Figure 8J:
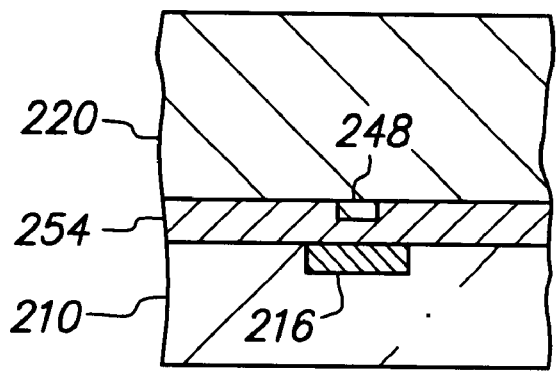
Figure 8K:
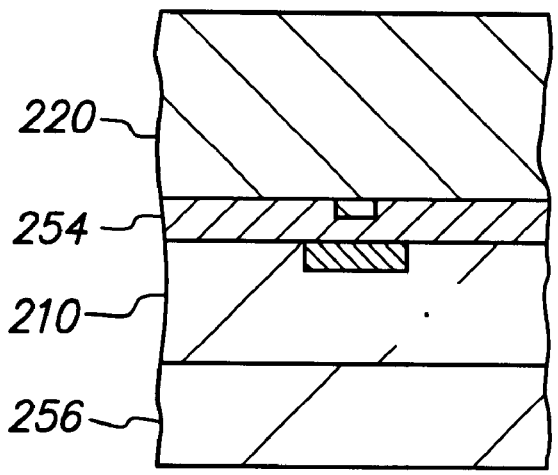
Figure 8L:
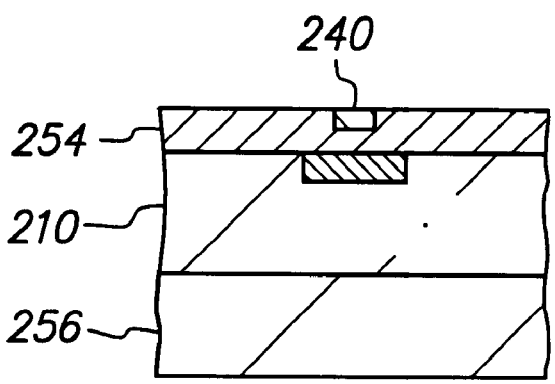
Figure 8M:
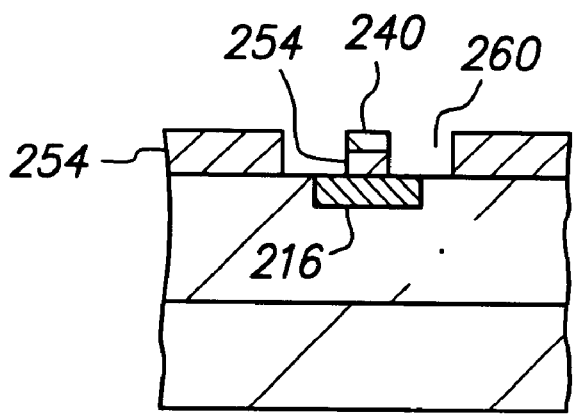
Figure 8N:
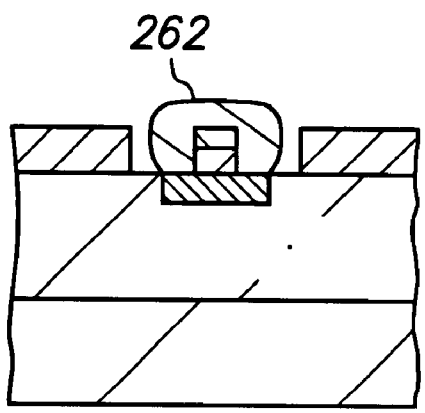
Figure 8O:
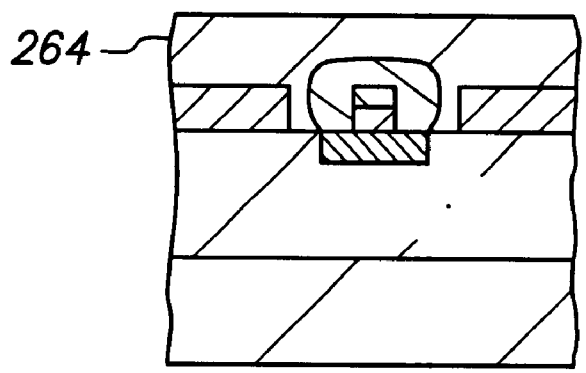

FIGS. 5A–5O, 6A–6O, 7A–7O and 8A–8O are cross-sectional, top, bottom and cross-sectional views, respectively, of a method of connecting a conductive trace to a semiconductor chip in accordance with a second embodiment of the present invention. FIGS. 8A–8O are oriented orthogonally with respect to FIGS. 5A–5O and depict FIGS. 5A–5O as viewed from left-to-right. In the second embodiment, the bumped terminal is disposed within the periphery of the chip, the adhesive fills the cavity, and the assembly is a chip size package. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, base 220 corresponds to base 120, etc.

FIGS. 5A, 6A, 7A and 8A are cross-sectional, top, bottom and cross-sectional views, respectively, of semiconductor chip 210 which includes upper surface 212 and lower surface 214. Upper surface 212 includes conductive pad 216 and passivation layer 218.

FIGS. 5B, 6B, 7B and 8B are cross-sectional, top, bottom and cross-sectional views, respectively, of base 220 which includes top surface 222 and bottom surface 224.

FIGS. 5C, 6C, 7C and 8C are cross-sectional, top, bottom and cross-sectional views, respectively, of photoresist layer 226 formed on bottom surface 224 of base 220. Photoresist layer 226 contains opening 228 that selectively exposes portion 230 of bottom surface 224.

FIGS. 5D, 6D, 7D and 8D are cross-sectional, top, bottom and cross-sectional views, respectively, of recess 232 formed in base 220 by wet chemical etching.

FIGS. 5E, 6E, 7E and 8E are cross-sectional, top, bottom and cross-sectional views, respectively, of base 220 after photoresist layer 226 is stripped.

FIGS. 5F, 6F, 7F and 8F are cross-sectional, top, bottom and cross-sectional views, respectively, of photoresist layer 234 formed on bottom surface 224 of base 220. Photoresist layer 234 contains opening 236 that selectively exposes portion 238 of bottom surface 224.

FIGS. 5G, 6G, 7G and 8G are cross-sectional, top, bottom and cross-sectional views, respectively, of conductive trace 240 formed on base 220 by electroplating. Conductive trace 240 includes top surface 242, bottom surface 244, bumped terminal 246 and routing line 248. Bumped terminal 246 includes or defines cavity 250 that extends into recess 232 and faces away from base 220, and routing line 248 includes enlarged rectangular portion 252 that is contiguous with and surrounds bumped terminal 246.

FIGS. 5H, 6H, 7H and 8H are cross-sectional, top, bottom and cross-sectional views, respectively, of base 220 and conductive trace 240 after photoresist layer 234 is stripped.

FIGS. 5I, 6I, 7I and 8I are cross-sectional, top, bottom and cross-sectional views, respectively, of adhesive 254 formed on base 220 and conductive trace 240. Adhesive 254 is applied as a liquid resin and fills cavity 250.

FIGS. 5J, 6J, 7J and 8J are cross-sectional, top, bottom and cross-sectional views, respectively, of chip 210 mechanically attached to conductive trace 240 by adhesive 254. Adhesive 254 is disposed within the periphery of chip 210 and does not extend to the outer edges of chip 210. In addition, chip 210 and conductive trace 240 are positioned relative to one another so that routing line 248 is disposed above and overlaps and is electrically isolated from pad 216, and bumped terminal 246 is disposed inside the periphery of chip 210 and outside the periphery of pad 216.

FIGS. 5K, 6K, 7K and 8K are cross-sectional, top, bottom and cross-sectional views, respectively, of encapsulant 256 formed on chip 210 by transfer molding.

FIGS. 5L, 6L, 7L and 8L are cross-sectional, top, bottom and cross-sectional views, respectively, of chip 210 and conductive trace 240 after base 220 is removed by wet chemical etching.

FIGS. 5M, 6M, 7M and 8M are cross-sectional, top, bottom and cross-sectional views, respectively, of opening 260 formed in adhesive 254 by laser ablation. Opening 260 exposes pad 216.

FIGS. 5N, 6N, 7N and 8N are cross-sectional, top, bottom and cross-sectional views, respectively, of connection joint 262 formed on routing line 248 and pad 216 by electroless plating.

FIGS. 5O, 6O, 7O and 8O are cross-sectional, top, bottom and cross-sectional views, respectively, of insulative base 264 formed on conductive trace 240, adhesive 254 and connection joint 262.

At this stage, the manufacture of semiconductor chip assembly 266 that includes chip 210, conductive trace 240, adhesive 254, encapsulant 256, connection joint 262 and insulative base 264 can be considered complete.

The semiconductor chip assemblies described above are merely exemplary. Numerous other embodiments are contemplated.

Figure 9:
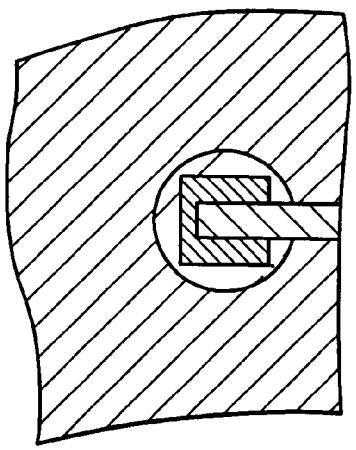
FIGS. 9–13 are top plan views of routing line variations in accordance with the present invention.
Figure 10:
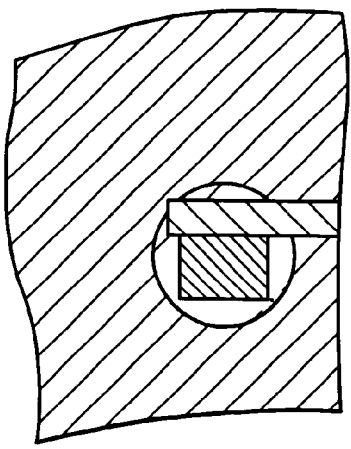
Figure 11:
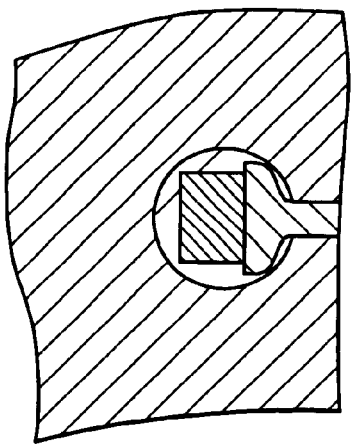
Figure 12:
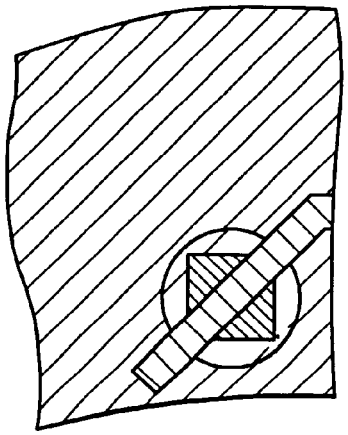
Figure 13:
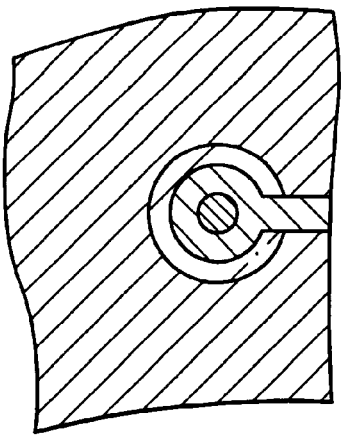

The conductive trace can have various shapes and sizes. The conductive trace can overlap various portions of the pad, such as two opposing peripheral edges and the center of the pad (FIGS. 2M and 6M), one peripheral edge and the center of the pad (FIG. 9), three peripheral edges but not the center of the pad (FIGS. 10 and 11), two corners and the center of the pad (FIG. 12) or four peripheral edges but not the center of the pad (FIG. 13).

The conductive trace can be various conductive metals including copper, gold, nickel, aluminum, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace can be formed on the metal base by numerous deposition techniques including electroplating and electroless plating.

The conductive trace can be deposited as a single layer or multiple layers. For instance, the conductive trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. If desired, the conductive trace can be spot plated near the pad to make it compatible with receiving the connection joint. For instance, a copper conductive trace can be spot plated with nickel and then silver to make it compatible with a gold ball bond connection joint and avoid the formation of brittle silver-copper intermetallic compounds.

As another example, the conductive trace can consist of a non-copper layer electroplated on a copper base and a copper layer electroplated on the non-copper layer. Suitable non-copper layers include nickel, gold, palladium and silver. After the conductive trace is attached to the chip by the adhesive, a wet chemical etch can be applied that is highly selective of copper with respect to the non-copper layer to remove the copper base without removing the copper or non-copper layers. The non-copper layer provides an etch stop that prevents the wet chemical etch from removing the copper layer. Furthermore, it is understood that in the context of the present invention, the conductive trace and the base are different metals (or metallic materials) even if a multi-layer conductive trace includes a single layer that is similar to the metal base (such as the example described above).

The conductive trace may function as a signal, power or ground layer depending on the purpose of the associated chip pad. Likewise, the conductive trace can fan-in or fan-out or both.

The bumped terminal is particularly well-suited for interconnecting to the next level assembly. The bumped terminal need not necessarily extend above the top surface of the insulative base, and a ball, a pad, or a pillar (columnar post) can be deposited on the bumped terminal or be a top portion of the bumped terminal. The bumped terminal can be disposed inside or outside the periphery of the chip, and the cavity can be filled with the encapsulant, the adhesive, another material, or left empty. Furthermore, the bumped terminal need not necessarily be located at a distal end of the conductive trace. For instance, the bumped terminal can be disposed within the periphery of the chip between the pad and an outer edge of the chip, the routing line can include a first portion that extends from the bumped terminal to the pad, and the routing line can include a second portion that extends from the bumped terminal to the outer edge and beyond the outer edge.

The metal base can be various metals including copper, copper alloys, iron-nickel alloys, aluminum, and so on.

The metal base need not necessarily be removed. For instance, a portion of the metal base above the pad can be selectively etched to permit formation of the opening in the adhesive, and another portion of the metal base that contacts the bumped terminal can remain intact and provide part of the conductive trace. Alternatively, a portion of the metal base above the pad can be selectively etched to permit formation of the opening in the adhesive, another portion of the metal base that contacts the bumped terminal can be selectively etched so that the bumped terminal is exposed and electrically isolated from the metal base, and another portion of the metal base that is disposed within the periphery of the chip can remain intact and provide a heat sink.

The pad can have numerous shapes including a flat rectangular shape and a bumped shape. For instance, a bump-shaped pad may extend into the opening in the adhesive and may even extend above the conductive trace. The pad can either be partially or completely exposed prior to forming the connection joint. The pad can have a length and width that are larger than, equal to, or smaller than the diameter of the opening in the adhesive. Preferably, the pad and opening have the same or similar size, and essentially all of the pad is directly beneath the opening.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited on the routing line but not the bumped terminal, or alternatively, deposited on the routing line and the bumped terminal and then etched back so that a top portion of the bumped terminal is exposed.

Numerous adhesives can be applied between the chip and the conductive trace. For instance, the adhesive can be silicone, polyimide or epoxy. The adhesive can be applied as a paste, a laminated layer, or a liquid applied by screen-printing, spin-on, or spray-on. If a paste or liquid adhesive is applied, the adhesive may contact the metal base, whereas if a laminated adhesive is applied then no appreciable amount of adhesive may contact the metal base. Thermosetting adhesive liquids and pastes such as epoxies are generally suitable. Likewise, thermoplastic adhesives are also generally suitable. Furthermore, the opening in the adhesive may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the adhesive.

Numerous etches can be applied to form the opening in the adhesive. For instance, the opening in the adhesive can be formed by laser direct write (without a mask) or a blanket plasma etch that removes portions of the adhesive not covered by the conductive trace. The opening may be aligned with and expose a single pad or a plurality of pads. Furthermore, the opening sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding. For instance, the encapsulant can be printed on the chip as an epoxy paste and then cured or hardened to form a solid adherent protective layer.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No, 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

After the insulative base is formed, further encapsulation can be performed but is generally not necessary. However, it may be desirable to provide further encapsulation to enhance the mechanical strength of the assembly in the event the encapsulant and/or insulative base are particularly thin or omitted.

After the insulative base is formed, a soldering material or solder ball can be deposited over the bumped terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the bumped terminal can be formed with a solder surface layer, thereby rendering additional soldering material unnecessary. That is, the bumped terminal itself can be reflowed to provide a solder joint for electrical connection with the next level assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted. Likewise, the metal base is shown above the conductive trace and the conductive trace is shown above the chip with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and the encapsulant protect the chip from handling damage and provide a known dielectric barrier for the conductive trace. The insulative base prevents solder reflow at the top surface from contacting or electrically shorting the underlying conductive trace. The bumped terminal yields enhanced reliability for the next level assembly that exceeds that of conventional BGA packages. The mode of the connection shifts from the initial mechanical coupling to metallurgical coupling to assure sufficient metallurgical bond strength. Furthermore, the conductive trace can be mechanically and metallurgically coupled to the chip without wire bonding, TAB, flip-chip bonding, plating, polishing, or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of connecting a conductive trace to a semiconductor chip, comprising:

providing a semiconductor chip, a conductive trace and a base, wherein the chip includes a conductive pad, the base includes a recess, the conductive trace includes a bumped terminal in the recess, the bumped terminal includes a cavity that extends into and faces away from the recess, the base contacts and covers the conductive trace on a side opposite the chip, and the conductive trace and the base are different metals; then mechanically attaching the chip to the conductive trace using an insulative adhesive that extends into the cavity; then etching the base, thereby exposing the conductive trace; and then forming a connection joint that contacts and electrically connects the conductive trace and the pad.

2. The method of claim 1, including etching the adhesive thereby exposing the pad after etching the base and before forming the connection joint.

3. The method of claim 2, wherein the adhesive contacts and is sandwiched between the conductive trace and the pad, and the conductive trace and the pad are electrically isolated from one another after etching the adhesive and before forming the connection joint.

4. The method of claim 1, wherein the adhesive fills the cavity.

5. The method of claim 1, including disposing the bumped terminal inside a periphery of the chip and outside a periphery of the pad, and disposing the conductive trace proximate to the pad.

6. The method of claim 1, including depositing the conductive trace on the base and then disposing the conductive trace proximate to the pad.

7. The method of claim 1, including forming the recess in the base and then depositing the conductive trace on the base.

8. The method of claim 1, including forming an encapsulant on the chip after mechanically attaching the chip to the conductive trace and before etching the base.

9. The method of claim 1, including forming an insulative base on the conductive trace, the adhesive and the connection joint such that the bumped terminal is exposed.

10. The method of claim 1, wherein the chip includes a plurality of conductive pads, a plurality of conductive traces are disposed proximate to the pads, the base contacts and covers the conductive traces on the side opposite the chip before etching the base, and the conductive traces are exposed by etching the base.

11. A method of connecting a conductive trace to a semiconductor chip, comprising:

providing a semiconductor chip that includes a conductive pad;

attaching a conductive trace to a base, wherein the conductive trace includes a bumped terminal and a routing line, the bumped terminal includes a cavity, the base includes a recess, the bumped terminal is in the recess, the cavity extends into the recess and faces away from the base, the routing line is outside the recess, and the conductive trace and the base are different metals; then disposing an insulative adhesive between the chip and the conductive trace, thereby mechanically attaching the chip to the conductive trace such that the conductive trace is disposed proximate to the pad and the adhesive extends into the cavity; then etching the base, thereby exposing the conductive trace; then etching the adhesive, thereby exposing the pad; and then forming a connection joint that contacts and electrically connects the conductive trace and the pad.

12. The method of claim 11, wherein attaching the conductive trace to the base includes plating the conductive trace on a selected portion of the base.

13. The method of claim 11, wherein disposing the adhesive includes contacting the adhesive to the chip and the conductive trace and then curing the adhesive.

14. The method of claim 11, wherein disposing the adhesive includes filling the adhesive into the cavity and then contacting the adhesive to the chip.

15. The method of claim 11, wherein attaching the chip to the conductive trace includes positioning the conductive trace such that the bumped terminal is inside a periphery of the chip and outside a periphery of the pad and the routing line overlaps the pad.

16. The method of claim 11, wherein etching the base includes applying a wet chemical etch to the base.

17. The method of claim 11, wherein etching the base includes removing a portion of the base that contacts the bumped terminal.

18. The method of claim 11, wherein etching the adhesive includes applying a laser to the adhesive.

19. The method of claim 11, wherein forming the connection joint includes plating a metal on the conductive trace and the pad.

20. The method of claim 11, wherein forming the connection joint includes wire bonding a ball bond on the conductive trace and the pad.

21. The method of claim 11, including forming an encapsulant on a side of the chip opposite the pad and outside the periphery of the chip after disposing the adhesive and before etching the base.

22. The method of claim 11, including forming an insulative base on the conductive trace, the adhesive and the connection joint such that the bumped terminal is exposed.

23. The method of claim 11, wherein the adhesive includes silicone, polyimide or epoxy.

24. The method of claim 11, wherein the adhesive is sandwiched between the routing line and the pad, and the connection joint contacts a surface of the routing line that overlaps and faces away from the pad.

25. The method of claim 11, wherein the adhesive is sandwiched between the routing line and the pad, and the connection joint contacts opposing peripheral sidewalls of the routing line that overlap and are orthogonal to the pad.

26. The method of claim 11, wherein the connection joint is the only electrical conductor external to the chip that contacts the pad.

27. The method of claim 11, wherein the connection joint and the adhesive are the only materials external to the chip that contact the pad.

28. The method of claim 11, wherein the connection joint and the adhesive are the only materials that contact both the conductive trace and the pad.

29. The method of claim 11, wherein the connection joint is devoid of wire bonds and solder joints.

30. The method of claim 11, wherein the chip includes a plurality of conductive pads, a plurality of conductive traces are disposed proximate to the pads, the base covers the conductive traces before etching the base, and the conductive traces are exposed by etching the base.

31. A method of connecting a conductive trace to a semiconductor chip, comprising the following steps in the sequence set forth:

forming a recess in a base;

forming a conductive trace on the base, wherein the conductive trace includes a bumped terminal in the recess and a routing line outside the recess, the bumped terminal includes a cavity that extends into and faces away from the recess, and the conductive trace and the base are different metallic materials;

disposing an insulative adhesive between a chip and the conductive trace, thereby mechanically attaching the chip to the conductive trace, wherein the chip includes a pad, the bumped terminal is disposed with a periphery of the chip, the routing line overlaps the pad, the base is disposed on a side of the conductive trace opposite the chip, and the adhesive fills the cavity;

applying an etch to the base that is selective of the base with respect to the conductive trace and the adhesive, thereby exposing the conductive trace;

applying an etch to the adhesive, thereby exposing the pad; and forming a connection joint that contacts and electrically connects the conductive trace and the pad.

32. The method of claim 31, wherein forming the recess in the base includes forming a photoresist layer on the base that selectively exposes the base and then etching the base.

33. The method of claim 31, wherein forming the conductive trace on the base includes forming a photoresist layer on the base that selectively exposes the base and then plating the conductive trace on the base.

34. The method of claim 31, wherein disposing the adhesive includes contacting the adhesive to the chip and the conductive trace and then hardening the adhesive.

35. The method of claim 31, wherein disposing the adhesive includes filling the adhesive into the cavity and then contacting the adhesive to the chip.

36. The method of claim 31, including forming an encapsulant on a side of the chip opposite the pad after mechanically attaching the chip to the conductive trace and before applying the etch to the base.

37. The method of claim 31, including forming an insulative base on the conductive trace, the adhesive and the connection joint such that the bumped terminal is exposed.

38. The method of claim 31, wherein applying the etch to the base removes a portion of the base that contacts the bumped terminal.

39. The method of claim 31, wherein applying the etch to the adhesive includes applying a laser etch that ablates the adhesive.

40. The method of claim 31, wherein applying the etch to the adhesive includes applying a blanket plasma etch.

41. The method of claim 31, wherein forming the connection joint includes electroplating a metal on the conductive trace and the pad.

42. The method of claim 31, wherein forming the connection joint includes electrolessly plating a metal on the conductive trace and the pad.

43. The method of claim 31, wherein forming the connection joint includes applying thermocompression or thermosonic wire bonding using a capillary that presses a ball bond against the conductive trace and the pad to form a ball bond that contacts and bonds to the conductive trace and the pad.

44. The method of claim 31, wherein the connection joint contacts a surface of the conductive trace that overlaps and faces away from the pad.

45. The method of claim 44, wherein the connection joint is the only electrical conductor external to the chip that contacts the pad.

46. The method of claim 44, wherein the connection joint and the adhesive are the only materials external to the chip that contact the pad.

47. The method of claim 44, wherein the connection joint and the adhesive are the only materials that contact both the conductive trace and the pad.

48. The method of claim 44, wherein the adhesive is sandwiched between the conductive trace and the pad after applying the etch to the adhesive.

49. The method of claim 31, wherein the conductive trace includes first and second metal layers, the first metal layer contacts the base, the second metal layer contacts the first metal layer and is separated from the base by the first metal layer, the second metal layer and the base are similar metallic materials, and the first metal layer and the base are different metallic materials.

50. The method of claim 31, wherein the chip includes a plurality of conductive pads, a plurality of conductive traces overlap the pads, the base covers the conductive traces before applying the etch to the base, and the conductive traces are exposed by applying the etch to the base.

51. A method of connecting a conductive trace to a semiconductor chip, comprising the following steps in the sequence set forth:

providing a metal base, providing a first mask on the base, wherein the first mask includes an opening that exposes a first portion of the base;

applying an etch to the first portion of the base through the opening in the first mask, thereby etching partially through the base and forming a recess in the base;

removing the first mask, providing a second mask on the base, wherein the second mask includes an opening that exposes a second portion of the base;

depositing a conductive trace on the second portion of the base through the opening in the second mask, wherein the conductive trace includes a bumped terminal and a routing line, the bumped terminal is formed in the recess, the routing line is formed outside the recess, and the bumped terminal includes a cavity that extends into and faces away from the base;

removing the second mask, thereby exposing outer edges of the conductive trace;

mechanically attaching a chip to the conductive trace using an insulative adhesive, wherein the chip includes a pad, the bumped terminal is disposed outside a periphery of the pad and inside a periphery of the chip, the routing line overlaps the pad and is positioned between the chip and the base, and the adhesive fills the cavity;

applying an etch that is selective of the base with respect to the conductive trace and the adhesive, thereby exposing the conductive trace;

applying an etch that is selective of the adhesive with respect to the conductive trace and the pad, thereby removing a portion of the adhesive and exposing the pad; and forming a connection joint that contacts and electrically connects the conductive trace and the pad, wherein the bumped terminal is electrically connected to the pad by the routing line and the connection joint.

52. The method of claim 51, wherein the first and second masks are photoresist.

53. The method of claim 51, wherein the adhesive is silicone, polyimide or epoxy.

54. The method of claim 51, wherein the adhesive is silicone.

55. The method of claim 51, wherein applying the etch that is selective of the base includes applying a wet chemical etch that is highly selective of copper with respect to gold.

56. The method of claim 51, wherein applying the etch that is selective of the adhesive includes applying a laser that ablates the adhesive.

57. The method of claim 51, wherein forming the connection joint includes electroplating a metal on the conductive trace and the pad.

58. The method of claim 51, wherein forming the connection joint includes electrolessly plating a metal on the conductive trace and the pad.

59. The method of claim 51, wherein the connection joint contacts a surface of the conductive trace that overlaps and faces away from the pad, the connection joint contacts opposing peripheral sidewalls of the conductive trace that overlap and are orthogonal to the pad, the connection joint is the only electrical conductor external to the chip that contacts the pad, the connection joint and the adhesive are the only materials external to the chip that contact the pad, the connection joint and the adhesive are the only materials that contact both the conductive trace and the pad, and the adhesive is sandwiched between the conductive trace and the pad.

60. The method of claim 51, wherein the chip includes a plurality of conductive pads, a plurality of conductive traces overlap the pads, the base covers the conductive traces before applying the etch to the base, and the conductive traces are exposed by applying the etch to the base.

61. A method of connecting a conductive trace to a semiconductor chip, comprising:

providing a semiconductor chip, a conductive trace and a base, wherein the chip includes a conductive pad, the base includes a recess, the conductive trace includes a bumped terminal in the recess, the bumped terminal includes a cavity that extends into and faces away from the recess, the base contacts and covers the conductive trace on a side opposite the chip, and the conductive trace and the base are different metals; then mechanically attaching the chip to the conductive trace using an insulative adhesive that extends into the cavity; then etching the base by applying an etch that is selective of the base with respect to the conductive trace, thereby removing portions of the base that overlap the bumped terminal and the pad and exposing the conductive trace; and then forming a connection joint that contacts and electrically connects the conductive trace and the pad.

62. The method of claim 61, including etching the adhesive thereby exposing the pad after etching the base and before forming the connection joint.

63. The method of claim 62, wherein the adhesive contacts and is sandwiched between the conductive trace and the pad, and the conductive trace and the pad are electrically isolated from one another after etching the adhesive and before forming the connection joint.

64. The method of claim 61, wherein the adhesive fills the cavity.

65. The method of claim 61, including disposing the bumped terminal inside a periphery of the chip and outside a periphery of the pad, and disposing the conductive trace proximate to the pad.

66. The method of claim 61, including depositing the conductive trace on the base and then disposing the conductive trace proximate to the pad.

67. The method of claim 61, including forming the recess in the base and then depositing the conductive trace on the base.

68. The method of claim 61, including forming an encapsulant on the chip after mechanically attaching the chip to the conductive trace and before etching the base.

69. The method of claim 61, including forming an insulative base on the conductive trace, the adhesive and the connection joint such that the bumped terminal is exposed.

70. The method of claim 61, wherein the chip includes a plurality of conductive pads, a plurality of conductive traces are disposed proximate to the pads, the base contacts and covers the conductive traces on the side opposite the chip before etching the base, and the conductive traces are exposed by etching the base.

71. A method of connecting a conductive trace to a semiconductor chip, comprising:

providing a semiconductor chip that includes a conductive pad;

attaching a conductive trace to a base, wherein the conductive trace includes a bumped terminal and a routing line, the bumped terminal includes a cavity, the base includes a recess, the bumped terminal is in the recess, the cavity extends into the recess and faces away from the base, the routing line is outside the recess, and the conductive trace and the base are different metals; then disposing an insulative adhesive between the chip and the conductive trace, thereby mechanically attaching the chip to the conductive trace such that the conductive trace is disposed proximate to the pad and the adhesive extends into the cavity; then etching the base by applying an etch that is selective of the base with respect to the conductive trace and the adhesive, thereby removing portions of the base that overlap the bumped terminal and the pad and exposing the conductive trace and the adhesive; then etching the adhesive, thereby exposing the pad; and then forming a connection joint that contacts and electrically connects the conductive trace and the pad.

72. The method of claim 71, wherein attaching the conductive trace to the base includes plating the conductive trace on a selected portion of the base.

73. The method of claim 71, wherein disposing the adhesive includes contacting the adhesive to the chip and the conductive trace and then curing the adhesive.

74. The method of claim 71, wherein disposing the adhesive includes filling the adhesive into the cavity and then contacting the adhesive to the chip.

75. The method of claim 71, wherein attaching the chip to the conductive trace includes positioning the conductive trace such that the bumped terminal is inside a periphery of the chip and outside a periphery of the pad and the routing line overlaps the pad.

76. The method of claim 71, wherein etching the base includes applying a wet chemical etch to the base.

77. The method of claim 71, wherein etching the base includes removing a portion of the base that contacts the bumped terminal.

78. The method of claim 71, wherein etching the adhesive includes applying a laser to the adhesive.

79. The method of claim 71, wherein forming the connection joint includes plating a metal on the conductive trace and the pad.

80. The method of claim 71, wherein forming the connection joint includes wire bonding a ball bond on the conductive trace and the pad.

81. The method of claim 71, including forming an encapsulant on a side of the chip opposite the pad and outside the periphery of the chip after disposing the adhesive and before etching the base.

82. The method of claim 71, including forming an insulative base on the conductive trace, the adhesive and the connection joint such that the bumped terminal is exposed.

83. The method of claim 71, wherein the adhesive includes silicone, polyimide or epoxy.

84. The method of claim 71, wherein the adhesive is sandwiched between the routing line and the pad, and the connection joint contacts a surface of the routing line that overlaps and faces away from the pad.

85. The method of claim 71, wherein the adhesive is sandwiched between the routing line and the pad, and the connection joint contacts opposing peripheral sidewalls of the routing line that overlap and are orthogonal to the pad.

86. The method of claim 71, wherein the connection joint is the only electrical conductor external to the chip that contacts the pad.

87. The method of claim 71, wherein the connection joint and the adhesive are the only materials external to the chip that contact the pad.

88. The method of claim 71, wherein the connection joint and the adhesive are the only materials that contact both the conductive trace and the pad.

89. The method of claim 71, wherein the connection joint is devoid of wire bonds and solder joints.

90. The method of claim 71, wherein the chip includes a plurality of conductive pads, a plurality of conductive traces are disposed proximate to the pads, the base covers the conductive traces before etching the base, and the conductive traces are exposed by etching the base.

91. A method of connecting a conductive trace to a semiconductor chip, comprising the following steps in the sequence set forth:

forming a recess in a base;

forming a conductive trace on the base, wherein the conductive trace includes a bumped terminal in the recess and a routing line outside the recess, the bumped terminal includes a cavity that extends into and faces away from the recess, and the conductive trace and the base are different metallic materials;

disposing an insulative adhesive between a chip and the conductive trace, thereby mechanically attaching the chip to the conductive trace, wherein the chip includes a pad, the bumped terminal is disposed with a periphery of the chip, the routing line overlaps the pad, the base is disposed on a side of the conductive trace opposite the chip, and the adhesive fills the cavity;

applying an etch to the base that is selective of the base with respect to the conductive trace and the adhesive, thereby removing potions of the base that overlap the bumped terminal and the pad and exposing the conductive trace and the adhesive;

applying an etch to the adhesive, thereby exposing the pad; and forming a connection joint that contacts and electrically connects the conductive trace and the pad.

92. The method of claim 91, wherein forming the recess in the base includes forming a photoresist layer on the base that selectively exposes the base and then etching the base.

93. The method of claim 91, wherein forming the conductive trace on the base includes forming a photoresist layer on the base that selectively exposes the base and then plating the conductive trace on the base.

94. The method of claim 91, wherein disposing the adhesive includes contacting the adhesive to the chip and the conductive trace and then hardening the adhesive.

95. The method of claim 91, wherein disposing the adhesive includes filling the adhesive into the cavity and then contacting the adhesive to the chip.

96. The method of claim 91, including forming an encapsulant on a side of the chip opposite the pad after mechanically attaching the chip to the conductive trace and before applying the etch to the base.

97. The method of claim 91, including forming an insulative base on the conductive trace, the adhesive and the connection joint such that the bumped terminal is exposed.

98. The method of claim 91, wherein applying the etch to the base removes a portion of the base that contacts the bumped terminal.

99. The method of claim 91, wherein applying the etch to the adhesive includes applying a laser etch that ablates the adhesive.

100. The method of claim 91, wherein applying the etch to the adhesive includes applying a blanket plasma etch.

101. The method of claim 91, wherein forming the connection joint includes electroplating a metal on the conductive trace and the pad.

102. The method of claim 91, wherein forming the connection joint includes electrolessly plating a metal on the conductive trace and the pad.

103. The method of claim 91, wherein forming the connection joint includes applying thermocompression or thermosonic wire bonding using a capillary that presses a wire ball against the conductive trace and the pad to form a ball bond that contacts and bonds to the conductive trace and the pad.

104. The method of claim 91, wherein the connection joint contacts a surface of the conductive trace that overlaps and faces away from the pad.

105. The method of claim 104, wherein the connection joint is the only electrical conductor external to the chip that contacts the pad.

106. The method of claim 104, wherein the connection joint and the adhesive are the only materials external to the chip that contact the pad.

107. The method of claim 104, wherein the connection joint and the adhesive are the only materials that contact both the conductive trace and the pad.

108. The method of claim 104, wherein the adhesive is sandwiched between the conductive trace and the pad after applying the etch to the adhesive.

109. The method of claim 91, wherein the conductive trace includes first and second metal layers, the first metal layer contacts the base, the second metal layer contacts the first metal layer and is separated from the base by the first metal layer, the second metal layer and the base are similar metallic materials, and the first metal layer and the base are different metallic materials.

110. The method of claim 91, wherein the chip includes a plurality of conductive pads, a plurality of conductive traces overlap the pads, the base covers the conductive traces before applying the etch to the base, and the conductive traces are exposed by applying the etch to the base.

111. A method of connecting a conductive trace to a semiconductor chip, comprising the following steps in the sequence set forth:

providing a metal base;

providing a first mask on the base, wherein the first mask includes an opening that exposes a first portion of the base;

applying an etch to the first portion of the base through the opening in the first mask, thereby etching partially through the base and forming a recess in the base;

removing the first mask;

providing a second mask on the base, wherein the second mask includes an opening that exposes a second portion of the base;

depositing a conductive trace on the second portion of the base through the opening in the second mask, wherein the conductive trace includes a bumped terminal and a routing line, the bumped terminal is formed in the recess, the routing line is formed outside the recess, and the bumped terminal includes a cavity that extends into and faces away from the base;

removing the second mask, thereby exposing outer edges of the conductive trace;

mechanically attaching a chip to the conductive trace using an insulative adhesive, wherein the chip includes a pad, the bumped terminal is disposed outside a periphery of the pad and inside a periphery of the chip, the routing line overlaps the pad and is positioned between the chip and the base, and the adhesive fills the cavity;

applying an etch that is selective of the base with respect to the conductive trace and the adhesive, thereby removing portions of the base that overlap the bumped terminal and the pad;

applying an etch that is selective of the adhesive with respect to the conductive trace and the pad, thereby removing a portion of the adhesive and exposing the pad; and forming a connection joint that contacts and electrically connects the conductive trace and the pad, wherein the bumped terminal is electrically connected to the pad by the routing line and the connection joint.

112. The method of claim 111, wherein the first and second masks are photoresist.

113. The method of claim 111, wherein the adhesive is silicone, polyimide or epoxy.

114. The method of claim 111, wherein the adhesive is silicone.

115. The method of claim 111, wherein applying the etch that is selective of the base includes applying a wet chemical etch that is highly selective of copper with respect to gold.

116. The method of claim 111, wherein applying the etch that is selective of the adhesive includes applying a laser that ablates the adhesive.

117. The method of claim 111, wherein forming the connection joint includes electroplating a metal on the conductive trace and the pad.

118. The method of claim 111, wherein forming the connection joint includes electrolessly plating a metal on the conductive trace and the pad.

119. The method of claim 111, wherein the connection joint contacts a surface of the conductive trace that overlaps and faces away from the pad, the connection joint contacts opposing peripheral sidewalls of the conductive trace that overlap and are orthogonal to the pad, the connection joint is the only electrical conductor external to the chip that contacts the pad, the connection joint and the adhesive are the only materials external to the chip that contact the pad, the connection joint and the adhesive are the only materials that contact both the conductive trace and the pad, and the adhesive is sandwiched between the conductive trace and the pad.

120. The method of claim 111, wherein the chip includes a plurality of conductive pads, a plurality of conductive traces overlap the pads, the base covers the conductive traces before applying the etch to the base, and the conductive traces are exposed by applying the etch to the base.

121. A method of connecting a conductive trace to a semiconductor chip, comprising:

providing a semiconductor chip, a conductive trace and a base, wherein the chip includes a conductive pad, the base includes a recess, the conductive trace includes a bumped terminal in the recess, the bumped terminal includes a cavity that extends into and faces away from the recess, the base contacts and covers the conductive trace on a side opposite the chip, and the conductive trace and the base are different metals; then mechanically attaching the chip to the conducive trace using an insulative adhesive that extends into the cavity; then etching the base by applying an etch that is selective of the base with respect to the conductive trace, thereby removing the base and exposing the conductive trace; and then forming a connection joint that contacts and electrically connects the conductive trace and the pad.

122. The method of claim 121, including etching the adhesive thereby exposing the pad after etching the base and before forming the connection joint.

123. The method of claim 122, wherein the adhesive contacts and is sandwiched between the conductive trace and the pad, and the conductive trace and the pad are electrically isolated from one another after etching the adhesive and before forming the connection joint.

124. The method of claim 121, wherein the adhesive fills the cavity.

125. The method of claim 121, including disposing the bumped terminal inside a periphery of the chip and outside a periphery of the pad, and disposing the conductive trace proximate to the pad.

126. The method of claim 121, including depositing the conductive trace on the base and then disposing the conductive trace proximate to the pad.

127. The method of claim 121, including forming the recess in the base and then depositing the conductive trace on the base.

128. The method of claim 121, including forming an encapsulant on the chip after mechanically attaching the chip to the conductive trace and before etching the base.

129. The method of claim 121, including forming an insulative base on the conductive trace, the adhesive and the connection joint such that the bumped terminal is exposed.

130. The method of claim 121, wherein the chip includes a plurality of conductive pads, a plurality of conductive traces are disposed proximate to the pads, the base contacts and covers the conductive traces on the side opposite the chip before etching the base, and the conductive traces are exposed by etching the base.

131. A method of connecting a conductive trace to a semiconductor chip, comprising:

providing a semiconductor chip that includes a conductive pad;

attaching a conductive trace to a base, wherein the conductive trace includes a bumped terminal and a routing line, the bumped terminal includes a cavity, the base includes a recess, the bumped terminal is in the recess, the cavity extends into the recess and faces away from the base, the routing line is outside the recess, and the conductive trace and the base are different metals; then disposing an insulative adhesive between the chip and the conductive trace, thereby mechanically attaching the chip to the conductive trace such that the conductive trace is disposed proximate to the pad and the adhesive extends into the cavity; then etching the base by applying an etch that is selective of the base with respect to the conductive trace and the adhesive, thereby removing the base and exposing the conductive trace and the adhesive; then etching the adhesive, thereby exposing the pad; and then forming a connection joint that contacts and electrically connects the conductive trace and the pad.

132. The method of claim 131, wherein attaching the conductive trace to the base includes plating the conductive trace on a selected portion of the base.

133. The method of claim 131, wherein disposing the adhesive includes contacting the adhesive to the chip and the conductive trace and then curing the adhesive.

134. The method of claim 131, wherein disposing the adhesive includes filling the adhesive into the cavity and then contacting the adhesive to the chip.

135. The method of claim 131, wherein attaching the chip to the conductive trace includes positioning the conductive trace such that the bumped terminal is inside a periphery of the chip and outside a periphery of the pad and the routing line overlaps the pad.

136. The method of claim 131, wherein etching the base includes applying a wet chemical etch to the base.

137. The method of claim 131, wherein etching the base includes removing a portion of the base that contacts the bumped terminal.

138. The method of claim 131, wherein etching the adhesive includes applying a laser to the adhesive.

139. The method of claim 131, wherein forming the connection joint includes plating a metal on the conductive trace and the pad.

140. The method of claim 131, wherein forming the connection joint includes wire bonding a ball bond on the conductive trace and the pad.

141. The method of claim 131, including forming an encapsulant on a side of the chip opposite the pad and outside the periphery of the chip after disposing the adhesive and before etching the base.

142. The method of claim 131, including forming an insulative base on the conductive trace, the adhesive and the connection joint such that the bumped terminal is exposed.

143. The method of claim 131, wherein the adhesive includes silicone, polyimide or epoxy.

144. The method of claim 131, wherein the adhesive is sandwiched between the routing line and the pad, and the connection joint contacts a surface of the routing line that overlaps and faces away from the pad.

145. The method of claim 131, wherein the adhesive is sandwiched between the routing line and the pad, and the connection joint contacts opposing peripheral sidewalls of the routing line that overlap and are orthogonal to the pad.

146. The method of claim 131, wherein the connection joint is the only electrical conductor external to the chip that contacts the pad.

147. The method of claim 131, wherein the connection joint and the adhesive are the only materials external to the chip that contact the pad.

148. The method of claim 131, wherein the connection joint and the adhesive are the only materials that contact both the conductive trace and the pad.

149. The method of claim 131, wherein the connection joint is devoid of wire bonds and solder joints.

150. The method of claim 131, wherein the chip includes a plurality of conductive pads, a plurality of conductive traces are disposed proximate to the pads, the base covers the conductive traces before etching the base, and the conductive traces are exposed by etching the base.

151. A method of connecting a conductive trace to a semiconductor chip, comprising the following steps in the sequence set forth:

forming a recess in a base;

forming a conductive trace on the base, wherein the conductive trace includes a bumped terminal in the recess and a routing line outside the recess, the bumped terminal includes a cavity that extends into and faces away from the recess, and the conductive trace and the base are different metallic materials;

disposing an insulative adhesive between a chip and the conductive trace, thereby mechanically attaching the chip to the conductive trace, wherein the chip includes a pad, the bumped terminal is disposed with a periphery of the chip, the routing line overlaps the pad, the base is disposed on a side of the conductive trace opposite the chip, and the adhesive fills the cavity;

applying an etch to the base that is selective of the base with respect to the conductive trace and the adhesive, thereby removing the base and exposing the conductive trace and the adhesive;

applying an etch to the adhesive, thereby exposing the pad; and forming a connection joint that contacts and electrically connects the conductive trace and the pad.

152. The method of claim 151, wherein forming the recess in the base includes forming a photoresist layer on the base that selectively exposes the base and then etching the base.

153. The method of claim 151, wherein forming the conductive trace on the base includes forming a photoresist layer on the base that selectively exposes the base and then plating the conductive trace on the base.

154. The method of claim 151, wherein disposing the adhesive includes contacting the adhesive to the chip and the conductive trace and then hardening the adhesive.

155. The method of claim 151, wherein disposing the adhesive includes filling the adhesive into the cavity and then contacting the adhesive to the chip.

156. The method of claim 151, including forming an encapsulant on a side of the chip opposite the pad after mechanically attaching the chip to the conductive trace and before applying the etch to the base.

157. The method of claim 151, including forming an insulative base on the conductive trace, the adhesive and the connection joint such that the bumped terminal is exposed.

158. The method of claim 151, wherein applying the etch to the base removes a portion of the base that contacts the bumped terminal.

159. The method of claim 151, wherein applying the etch to the adhesive includes applying a laser etch that ablates the adhesive.

160. The method of claim 151, wherein applying the etch to the adhesive includes applying a blanket plasma etch.

161. The method of claim 151, wherein forming the connection joint includes electroplating a metal on the conductive trace and the pad.

162. The method of claim 151, wherein forming the connection joint includes electrolessly plating a metal on the conductive trace and the pad.

163. The method of claim 151, wherein forming the connection joint includes applying thermocompression or thermosonic wire bonding using a capillary that presses a wire ball against the conductive trace and the pad to form a ball bond that contacts and bonds to the conductive trace and the pad.

164. The method of claim 151, wherein the connection joint contacts a surface of the conductive trace that overlaps and faces away from the pad.

165. The method of claim 164, wherein the connection joint is the only electrical conductor external to the chip that contacts the pad.

166. The method of claim 164, wherein the connection joint and the adhesive are the only materials external to the chip that contact the pad.

167. The method of claim 164, wherein the connection joint and the adhesive are the only materials that contact both the conductive trace and the pad.

168. The method of claim 164, wherein the adhesive is sandwiched between the conductive trace and the pad after applying the etch to the adhesive.

169. The method of claim 151, wherein the conductive trace includes first and second metal layers, the first metal layer contacts the base, the second metal layer contacts the first metal layer and is separated from the base by the first metal layer, the second metal layer and the base are similar metallic materials, and the first metal layer and the base are different metallic materials.

170. The method of claim 151, wherein the chip includes a plurality of conductive pads, a plurality of conductive traces overlap the pads, the base covers the conductive traces before applying the etch to the base, and the conductive traces are exposed by applying the etch to the base.

171. A method of connecting a conductive trace to a semiconductor chip, comprising the following steps in the sequence set forth:

providing a metal base;

providing a first mask on the base, wherein the first mask includes an opening that exposes a first portion of the base;

applying an etch to the first portion of the base through the opening in the first mask, thereby etching partially through the base and forming a recess in the base;

removing the first mask;

providing a second mask on the base, wherein the second mask includes an opening that exposes a second portion of the base;

depositing a conductive trace on the second portion of the base through the opening in the second mask, wherein the conductive trace includes a bumped terminal and a routing line, the bumped terminal is formed in the recess, the routing line is formed outside the recess, and the bumped terminal includes a cavity that extends into and faces away from the base;

removing the second mask, thereby exposing outer edges of the conductive trace;

mechanically attaching a chip to the conductive trace using an insulative adhesive, wherein the chip includes a pad, the bumped terminal is disposed outside a periphery of the pad and inside a periphery of the chip, the routing line overlaps the pad and is positioned between the chip and the base, and the adhesive fills the cavity;

applying an etch that is selective of the base with respect to the conductive trace and the adhesive, thereby removing the base;

applying an etch that is selective of the adhesive with respect to the conductive trace and the pad, thereby removing a portion of the adhesive and exposing the pad; and forming a connection joint that contacts and electrically connects the conductive trace and the pad, wherein the bumped terminal is electrically connected to the pad by the routing line and the connection joint.

172. The method of claim 171, wherein the first and second masks are photoresist.

173. The method of claim 171, wherein the adhesive is silicone, polyimide or epoxy.

174. The method of claim 171, wherein the adhesive is silicone.

175. The method of claim 171, wherein applying the etch that is selective of the base includes applying a wet chemical etch that is highly selective of copper with respect to gold.

176. The method of claim 171, wherein applying the etch that is selective of the adhesive includes applying a laser that ablates the adhesive.

177. The method of claim 171, wherein forming the connection joint includes electroplating a metal on the conductive trace and the pad.

178. The method of claim 171, wherein forming the connection joint includes electrolessly plating a metal on the conductive trace and the pad.

179. The method of claim 171, wherein the connection joint contacts a surface of the conductive trace that overlaps and faces away from the pad, the connection joint contacts opposing peripheral sidewalls of the conductive trace that overlap and are orthogonal to the pad, the connection joint is the only electrical conductor external to the chip that contacts the pad, the connection joint and the adhesive are the only materials external to the chip that contact the pad, the connection joint and the adhesive are the only materials that contact both the conductive trace and the pad, and the adhesive is sandwiched between the conductive trace and the pad.

180. The method of claim 171, wherein the chip includes a plurality of conductive pads, a plurality of conductive traces overlap the pads, the base covers the conductive traces before applying the etch to the base, and the conductive traces are exposed by applying the etch to the base.

* * * * *

UNITED STATES PATENT AND TRADEMARK OFFICE
CERTIFICATE OF CORRECTION

PATENT NO. : 6,492,252 B1
DATED : December 10, 2002
INVENTOR(S) : Charles W.C. Lin et al.

It is certified that error appears in the above-identified patent and that said Letters Patent is hereby corrected as shown below:

Column 18,
Line 58, change "with" to -- within --.

Column 23,
Line 30, change "with" to -- within --.

Column 27,
Line 65, change "with" to -- within --.

Signed and Sealed this

Fourth Day of March, 2003

JAMES E. ROGAN
*Director of the United States Patent and Trademark Office*